US012308819B2

(12) United States Patent
Huang et al.

(10) Patent No.: US 12,308,819 B2
(45) Date of Patent: May 20, 2025

(54) SURFACE ACOUSTIC WAVE RESONATOR DEVICE AND MANUFACTURING METHOD THEREFOR AND FILTER

(71) Applicant: Shenzhen Newsonic Technologies Co., Ltd., Guangdong (CN)

(72) Inventors: Lei Huang, Guangdong (CN); Jie Zou, Guangdong (CN); Gongbin Tang, Guangdong (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/937,141

(22) Filed: Nov. 5, 2024

(65) Prior Publication Data

US 2025/0062741 A1 Feb. 20, 2025

(30) Foreign Application Priority Data

Dec. 13, 2023 (CN) ........................ 202311703662.0

(51) Int. Cl.

*H03H 9/02* (2006.01)
*H03H 3/08* (2006.01)
*H03H 9/145* (2006.01)
*H03H 9/25* (2006.01)

(52) U.S. Cl.

CPC .......... *H03H 9/02818* (2013.01); *H03H 3/08* (2013.01); *H03H 9/02637* (2013.01); *H03H 9/02944* (2013.01); *H03H 9/145* (2013.01); *H03H 9/25* (2013.01)

(58) Field of Classification Search

CPC ........... H03H 9/02818; H03H 9/02637; H03H 9/02944; H03H 9/145; H03H 9/25
USPC ...... 310/313 R, 313 A, 313 B, 313 C, 313 D
See application file for complete search history.

(56) References Cited

U.S. PATENT DOCUMENTS

2013/0207514 A1* 8/2013 Sakaguchi ............. H10N 30/87
310/313 B

FOREIGN PATENT DOCUMENTS

CN 116865707 A 10/2023

* cited by examiner

*Primary Examiner* — Derek J Rosenau
(74) *Attorney, Agent, or Firm* — LEASON ELLIS LLP

(57) ABSTRACT

A surface acoustic wave resonator device and manufacturing method therefor and filter, the surface acoustic wave resonator device includes: an interdigital transducer, disposed on a piezoelectric substrate and including first and second interdigital electrode lead-out parts, and first and second interdigital electrodes located in the body region and respectively connected to the first and second interdigital electrode lead-out parts; and a conductive structure, disposed on a side of the interdigital transducer away from the piezoelectric substrate, and at least includes a body structure and a first sawtooth structure, the body structure continuously extends across the interdigital electrodes in the second direction, the first sawtooth structure is located at a side of the body structure, and at least a portion of the body structure and the first sawtooth structure overlap with end portions of the interdigital electrodes close to a periphery region in the third direction.

20 Claims, 13 Drawing Sheets

SURFACE ACOUSTIC WAVE RESONATOR DEVICE AND MANUFACTURING METHOD THEREFOR AND FILTER

CROSS-REFERENCE TO RELATED APPLICATION(S)

The application claims priority to the Chinese patent application No. 202311703662.0, filed on Dec. 13, 2023, the entire disclosure of which is incorporated herein by reference as part of the present application.

TECHNICAL FIELD

Embodiments of the present disclosure relate to the field of resonators and filters, and in particular relate to a surface acoustic wave resonator device, a manufacturing method therefor and a filter.

BACKGROUND

With the rapid development of mobile communication technologies, filters based on resonators are more and more widely and extensively applied in communication devices such as smart phones. As a kind of acoustic wave filter, surface acoustic wave (SAW) filter has the advantages of small volume and light weight, etc., and is widely used in current communication devices. Clutters in spurious modes are present in traditional surface acoustic wave resonators/filters, which will affect the performance of the resonators/filters. How to improve the clutter suppression capability of the resonator device is an important research topic in this field.

SUMMARY

At least one embodiment of the present disclosure provides a surface acoustic wave resonator device, having a body region and a peripheral region, wherein the peripheral region includes a first peripheral region and a second peripheral region located at two opposite sides of the body region in a first direction, the surface acoustic wave resonator device includes: a piezoelectric substrate; an interdigital transducer, disposed on a side of the piezoelectric substrate and including a plurality of interdigital electrodes, a first interdigital electrode lead-out part and a second interdigital electrode lead-out part, wherein the plurality of interdigital electrodes include a first interdigital electrode and a second interdigital electrode extending along the first direction and alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a conductive structure, disposed on a side of the interdigital transducer away from the piezoelectric substrate, and at least overlapping with end portions of the plurality of interdigital electrodes close to the peripheral region in a third direction perpendicular to a main surface of the piezoelectric substrate, wherein the conductive structure at least includes a body structure and a first sawtooth structure, the body structure continuously extends across the plurality of interdigital electrodes in the second direction, the first sawtooth structure is located at a side of the body structure away from the peripheral region in the first direction, and at least a portion of the body structure and the first sawtooth structure overlap with the end portions of the plurality of interdigital electrodes in the third direction.

In the surface acoustic wave resonator device provided by at least one embodiment of the present disclosure, the body structure overlaps with the plurality of interdigital electrodes in the third direction, and overlaps with a gap between adjacent interdigital electrodes; and an orthographic projection of the first sawtooth structure on the piezoelectric substrate is offset from an orthographic projection of the gap between the adjacent interdigital electrodes on the piezoelectric substrate.

In the surface acoustic wave resonator device provided by at least one embodiment of the present disclosure, an orthographic projection of the first sawtooth structure on the piezoelectric substrate is located within a range of orthographic projections of the plurality of interdigital electrodes on the piezoelectric substrate.

In the surface acoustic wave resonator device provided by at least one embodiment of the present disclosure, the conductive structure includes: a first conductive layer, including a first body part and a first sawtooth part connected with each other, wherein the first sawtooth part at least includes a first internal sawtooth located at a side of the first body part away from the first peripheral region; and a second conductive layer, disposed side by side with the first conductive layer in the first direction and including a second body part and a second sawtooth part connected with each other, wherein the second sawtooth part at least includes a second internal sawtooth located at a side of the second body part away from the second peripheral region; the first body part and the second body part constitute the body structure, and the first internal sawtooth and the second internal sawtooth constitute the first sawtooth structure, wherein the first body part and the second body part each have a first sidewall and a second sidewall opposite to each other in the first direction, and the first internal sawtooth and the second internal sawtooth each include a plurality of internal extension parts protruding from the first sidewall of a corresponding body part, wherein the plurality of internal extension parts are arranged at intervals along the second direction and respectively overlap with the plurality of interdigital electrodes in the third direction.

In the surface acoustic wave resonator device provided by at least one embodiment of the present disclosure, among an internal extension part in the first internal sawtooth or the second internal sawtooth and an interdigital electrode overlapping with each other, an orthographic projection of the internal extension part on the piezoelectric substrate is located within a range of an orthographic projection of the interdigital electrode on the piezoelectric substrate.

In the surface acoustic wave resonator device provided by at least one embodiment of the present disclosure, in the first internal sawtooth or the second internal sawtooth, a spacing between adjacent internal extension parts among the plurality of internal extension parts in the second direction is greater than or equal to a spacing between adjacent interdigital electrodes among the plurality of interdigital electrodes.

In the surface acoustic wave resonator device provided by at least one embodiment of the present disclosure, among an internal extension part and an interdigital electrode overlapping with each other, a width of the internal extension part in the second direction is smaller than or equal to a width of the interdigital electrode in the second direction.

In the surface acoustic wave resonator device provided by at least one embodiment of the present disclosure, among an internal extension part and an interdigital electrode overlapping with each other, two sidewalls of the internal extension part that are opposite to each other in the second direction are respectively aligned, in the third direction, with two sidewalls of the interdigital electrode that are opposite to each other in the second direction.

In the surface acoustic wave resonator device provided by at least one embodiment of the present disclosure, the first interdigital electrode has a first electrode edge that is away from the first interdigital electrode lead-out part in the first direction; the second interdigital electrode has a second electrode edge that is away from the second interdigital electrode lead-out part in the first direction, wherein the second sidewall of the first body part and the second electrode edge are aligned with each other in the third direction; the second sidewall of the second body part and the first electrode edge are aligned with each other in the third direction.

In the surface acoustic wave resonator device provided by at least one embodiment of the present disclosure, the first peripheral region has a first peripheral width defined by a spacing between the second electrode edge and the first interdigital electrode lead-out part in the first direction, and the second peripheral region has a second peripheral width defined by a spacing between the first electrode edge and the second interdigital electrode lead-out part in the first direction; a width of the first internal sawtooth in the first direction is within 20% of the first peripheral width, and a width of the second internal sawtooth in the first direction is within 20% of the second peripheral width.

In the surface acoustic wave resonator device provided by at least one embodiment of the present disclosure, the second sidewall of the first body part is offset in the first direction towards the first interdigital electrode lead-out part with respect to a second electrode edge of the second interdigital electrode, and the first body part also overlaps, in the third direction, with a connecting part of the first interdigital electrode located in the first peripheral region; or the second sidewall of the second body part is offset in the first direction towards the second interdigital electrode lead-out part with respect to a first electrode edge of the first interdigital electrode, and the second body part also overlaps, in the third direction, with a connecting part of the second interdigital electrode located in the second peripheral region.

In the surface acoustic wave resonator device provided by at least one embodiment of the present disclosure, the conductive structure further includes a second sawtooth structure located at a side of the body structure close to the peripheral region in the first direction, and at least a portion of the second sawtooth structure overlaps with the plurality of interdigital electrodes in the third direction.

In the surface acoustic wave resonator device provided by at least one embodiment of the present disclosure, the first interdigital electrode has a first electrode edge that is away from the first interdigital electrode lead-out part in the first direction; the second interdigital electrode has a second electrode edge that is away from the second interdigital electrode lead-out part in the first direction; wherein the second sawtooth structure extends beyond at least one of the first electrode edge and the second electrode edge in the first direction, and at least a portion of the second sawtooth structure is located in the peripheral region; or the second sawtooth structure has a sidewall aligned with the first electrode edge or the second electrode edge in the third direction.

In the surface acoustic wave resonator device provided by at least one embodiment of the present disclosure, the second sawtooth structure overlaps, in the third direction, with at least one of, end portions of the plurality of interdigital electrodes close to the peripheral region and connecting parts of the plurality of interdigital electrodes located in the peripheral region.

In the surface acoustic wave resonator device provided by at least one embodiment of the present disclosure, the first sawtooth part further includes a first external sawtooth located at a side of the first body part close to the first peripheral region, and the second sawtooth part further includes a second external sawtooth located at a side of the second body part close to the second peripheral region; the second sawtooth structure includes at least one of the first external sawtooth and the second external sawtooth.

In the surface acoustic wave resonator device provided by at least one embodiment of the present disclosure, the first external sawtooth and the second external sawtooth each include a plurality of external extension parts, the plurality of external extension parts protrude from the second sidewall of a corresponding body part in the first direction and are arranged at intervals along the second direction; the plurality of external extension parts of the first external sawtooth at least include a first extension sub-part, and the first extension sub-part overlaps with the first interdigital electrode in the third direction; the plurality of external extension parts of the second external sawtooth at least include a second extension sub-part, and the second extension sub-part overlaps with the second interdigital electrode in the third direction.

In the surface acoustic wave resonator device provided by at least one embodiment of the present disclosure, an orthographic projection of the first extension sub-part on the piezoelectric substrate is located within a range of an orthographic projection of the first interdigital electrode on the piezoelectric substrate, and an orthographic projection of the second extension sub-part on the piezoelectric substrate is located within a range of an orthographic projection of the second interdigital electrode on the piezoelectric substrate.

In the surface acoustic wave resonator device provided by at least one embodiment of the present disclosure, the plurality of external extension parts of the first external sawtooth further include a first additional extension sub-part, and an orthographic projection of the first additional extension sub-part on the piezoelectric substrate is at least partially aligned, in the first direction, with an orthographic projection of the second interdigital electrode on the piezoelectric substrate; and the plurality of external extension parts of the second external sawtooth further include a second additional extension sub-part, and an orthographic projection of the second additional extension sub-part on the piezoelectric substrate is at least partially aligned, in the first direction, with an orthographic projection of the first interdigital electrode on the piezoelectric substrate.

In the surface acoustic wave resonator device provided by at least one embodiment of the present disclosure, the orthographic projection of the first additional extension sub-part borders, or is offset from or partially overlapped with the orthographic projection of the second interdigital electrode, or the orthographic projection of the first additional extension sub-part is located within a range of the orthographic projection of the second interdigital electrode; the orthographic projection of the second additional extension sub-part borders, or is offset from or partially overlapped with the orthographic projection of the first interdigital electrode, or the orthographic projection of the second additional extension sub-part is located within a range of the orthographic projection of the first interdigital electrode.

In the surface acoustic wave resonator device provided by at least one embodiment of the present disclosure, in the first conductive layer or the second conductive layer, a number of the plurality of internal extension parts is greater than or equal to a number of the plurality of external extension parts.

In the surface acoustic wave resonator device provided by at least one embodiment of the present disclosure, in the first conductive layer or the second conductive layer, in the second direction, a spacing between adjacent internal extension parts among the plurality of internal extension parts is smaller than or equal to a spacing between adjacent external extension parts among the plurality of external extension parts.

In the surface acoustic wave resonator device provided by at least one embodiment of the present disclosure, the first internal sawtooth and the first external sawtooth are symmetrically disposed with respect to the first body part; and/or the second internal sawtooth and the second external sawtooth are symmetrically disposed with respect to the second body part.

In the surface acoustic wave resonator device provided by at least one embodiment of the present disclosure, widths of the first internal sawtooth and the first external sawtooth in the first direction are equal to or different from each other; widths of the second internal sawtooth and the second external sawtooth in the first direction are equal to or different from each other.

In the surface acoustic wave resonator device provided by at least one embodiment of the present disclosure, an orthographic projection of the second sidewall of the first body part on the piezoelectric substrate is aligned, in the second direction, with an orthographic projection of the second electrode edge of the second interdigital electrode away from the second interdigital electrode lead-out part on the piezoelectric substrate; an orthographic projection of the second sidewall of the second body part on the piezoelectric substrate is aligned, in the second direction, with an orthographic projection of the first electrode edge of the first interdigital electrode away from the first interdigital electrode lead-out part on the piezoelectric substrate.

In the surface acoustic wave resonator device provided by at least one embodiment of the present disclosure, a sum of a width of the first internal sawtooth and a width of the first external sawtooth in the first direction is within 20% of the first peripheral width of the first peripheral region, and a sum of a width of the second internal sawtooth and a width of the second external sawtooth in the first direction is within 20% of the second peripheral width of the second peripheral region.

In the surface acoustic wave resonator device provided by at least one embodiment of the present disclosure, the second sidewall of the first body part is offset in the first direction away from the first peripheral region or towards the first peripheral region with respect to the second electrode edge of the second interdigital electrode; the second sidewall of the second body part is offset in the first direction away from the second peripheral region or towards the second peripheral region with respect to the first electrode edge of the first interdigital electrode.

In the surface acoustic wave resonator device provided by at least one embodiment of the present disclosure, further including: reflecting gratings, disposed on two opposite sides of the interdigital transducer in the second direction, wherein each reflecting grating includes a plurality of reflective electrodes and a busbar, the plurality of reflective electrodes extend along the first direction and are arranged at intervals along the second direction, and the busbar extends along the second direction and is connected to the plurality of reflective electrodes, wherein the conductive structure further partially overlaps with the reflecting grating in the third direction.

In the surface acoustic wave resonator device provided by at least one embodiment of the present disclosure, the conductive structure has a central region and an additional region; in the central region, the conductive structure overlaps with the plurality of interdigital electrodes in the third direction; in the additional region, the conductive structure overlaps with the plurality of reflective electrodes of the reflecting gratings in the third direction; the first body part and the second body part each extend continuously from the central region to the additional region.

In the surface acoustic wave resonator device provided by at least one embodiment of the present disclosure, in the additional region, the first conductive layer further includes a first additional sawtooth structure, which is located on one side or two opposite sides of the first body part in the first direction; the second conductive layer further includes a second additional sawtooth structure, which is located at one side or two opposite sides of the second body part in the first direction.

In the surface acoustic wave resonator device provided by at least one embodiment of the present disclosure, the first additional sawtooth structure includes at least one of a first additional internal extension part and a first additional external extension part, wherein the first additional internal extension part protrudes from the first sidewall of the first body part in the first direction away from the first peripheral region, and the first additional external extension part protrudes from the second sidewall of the first body part in the first direction towards the first peripheral region; the second additional sawtooth structure includes at least one of a second additional internal extension part and a second additional external extension part, wherein the second additional internal extension part protrudes from the first sidewall of the second body part in the first direction away from the second peripheral region, and the second additional external extension part protrudes from the second sidewall of the second body part in the first direction towards the second peripheral region.

In the surface acoustic wave resonator device provided by at least one embodiment of the present disclosure, orthographic projections of the first additional sawtooth structure and the second additional sawtooth structure on the piezoelectric substrate are located within a range of an orthographic projection of the reflecting grating on the piezoelectric substrate.

In the surface acoustic wave resonator device provided by at least one embodiment of the present disclosure, further including: a dielectric layer, disposed on the piezoelectric substrate and covering the interdigital transducer, wherein the conductive structure is located on a side of the dielectric layer away from the piezoelectric substrate.

At least one embodiment of the present disclosure provides a filter, including any one of the above-described surface acoustic wave resonator devices.

At least one embodiment of the present disclosure provides a manufacturing method for a surface acoustic wave resonator device, wherein the surface acoustic wave resonator device has a body region and a peripheral region, and the peripheral region includes a first peripheral region and a second peripheral region located at two opposite sides of the body region in a first direction, the manufacturing method includes: providing a piezoelectric substrate; forming an interdigital transducer on a side of the piezoelectric substrate, wherein the interdigital transducer includes a plurality of interdigital electrodes, a first interdigital electrode lead-out part and a second interdigital electrode lead-out part, and the plurality of interdigital electrodes include a first interdigital electrode and a second interdigital electrode extending along the first direction and alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and forming a conductive structure on a side of the interdigital transducer away from the piezoelectric substrate, wherein the conductive structure at least overlaps with end portions of the plurality of interdigital electrodes close to the peripheral region in a third direction perpendicular to a main surface of the piezoelectric substrate, wherein the conductive structure at least includes a body structure and a first sawtooth structure, the body structure continuously extends across the plurality of interdigital electrodes in the second direction, the first sawtooth structure is located at a side of the body structure away from the peripheral region in the first direction, and at least a portion of the body structure and the first sawtooth structure overlap with the end portions of the plurality of interdigital electrodes in the third direction.

In the manufacturing method for the surface acoustic wave resonator device provided by at least one embodiment of the present disclosure, wherein before forming the conductive structure, further including: forming a dielectric layer on a side of the interdigital transducer away from the piezoelectric substrate, wherein the conductive structure is formed on a side of the dielectric layer away from the piezoelectric substrate.

BRIEF DESCRIPTION OF THE DRAWINGS

In order to more clearly explain the technical solution of the embodiments of the present disclosure, the drawings of the embodiments will be briefly introduced below. It is obvious that the drawings in the following description only relate to some embodiments of the present disclosure, but do not intend to limit the present disclosure.

DETAILED DESCRIPTION

Figure 1A:
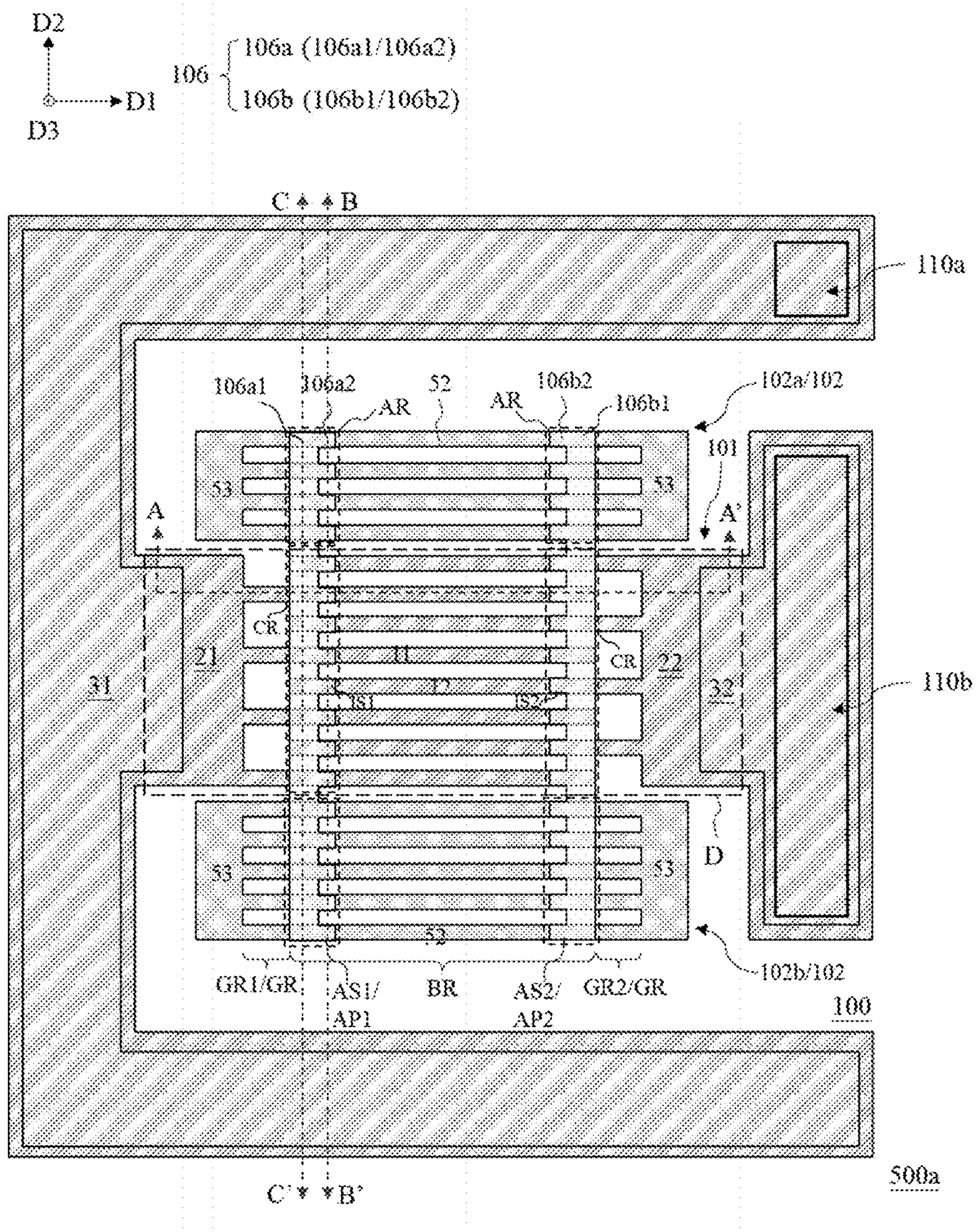
FIG. 1A illustrates a schematic top view of a surface acoustic wave resonator device according to some embodiments of the present disclosure.

In order to make objects, technical solutions and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

The embodiments of the present disclosure provide a surface acoustic wave resonator device and method of manufacturing the same, and filter, the surface acoustic wave resonator device has a body region and a peripheral region, wherein the peripheral region includes a first peripheral region and a second peripheral region located at two opposite sides of the body region in a first direction, and the surface acoustic wave resonator device includes: a piezoelectric substrate; an interdigital transducer, disposed on a side of the piezoelectric substrate and including a plurality of interdigital electrodes, a first interdigital electrode lead-out part and a second interdigital electrode lead-out part, wherein the plurality of interdigital electrodes include a first interdigital electrode and a second interdigital electrode extending along the first direction and alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a conductive structure, disposed on a side of the interdigital transducer away from the piezoelectric substrate, and at least overlapping with end portions of the plurality of interdigital electrodes close to the peripheral region in a third direction perpendicular to a main surface of the piezoelectric substrate, wherein the conductive structure at least includes a body structure and a first sawtooth structure, the body structure continuously extends across the plurality of interdigital electrodes in the second direction, the first sawtooth structure is located at a side of the body structure away from the peripheral region in the first direction, and at least a portion of the body structure and the first sawtooth structure overlap with the end portions of the plurality of interdigital electrodes in the third direction.

The surface acoustic wave resonator device, the manufacturing method therefor and the filter of the embodiments of the present disclosure can achieve the following technical effects: the clutter that may exist in the resonator device can be suppressed by disposing the conductive structure, that is, the conductive structure can be used as a clutter suppression structure; the conductive structure at least includes a body structure and a first sawtooth structure so that an overlapping area of the conductive structure and the interdigital electrodes can be increased by further disposing the first sawtooth structure on the basis of the body structure, thereby improving the clutter suppression capability of the conductive structure, and further reducing or eliminating the clutters in the resonator device and filter, and improving device performance. Moreover, the first sawtooth structure is disposed at a side of the body structure away from the peripheral region, so that an overlapping area between the first sawtooth structure and the interdigital electrodes can be relatively maximized, thereby maximizing the enhancement effect of the first sawtooth structure in terms of the clutter suppression capability.

In addition, the conductive structure is configured to include both the body structure and the sawtooth structure so that on the one hand, the structural stability thereof can be ensured, and on the other hand, the overall area of the conductive structure can be relatively reduced while increasing the overlapping area of the conductive structure and the interdigital electrodes, which is beneficial to reducing the ohmic loss while improving the clutter suppression capability of the resonator device, thereby improving the device performance.

Figure 1B:
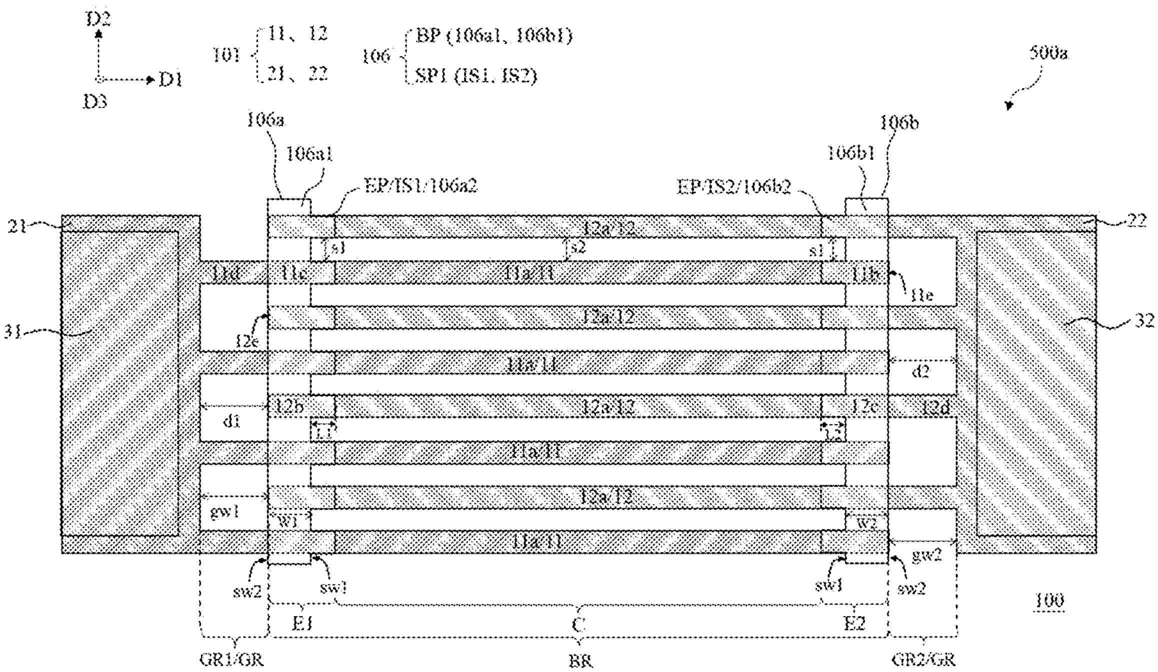
FIG. 1B illustrates a schematic enlarged top view of a partial region of the surface acoustic wave resonator device shown in FIG. 1A according to some embodiments of the present disclosure.
Figure 2A:
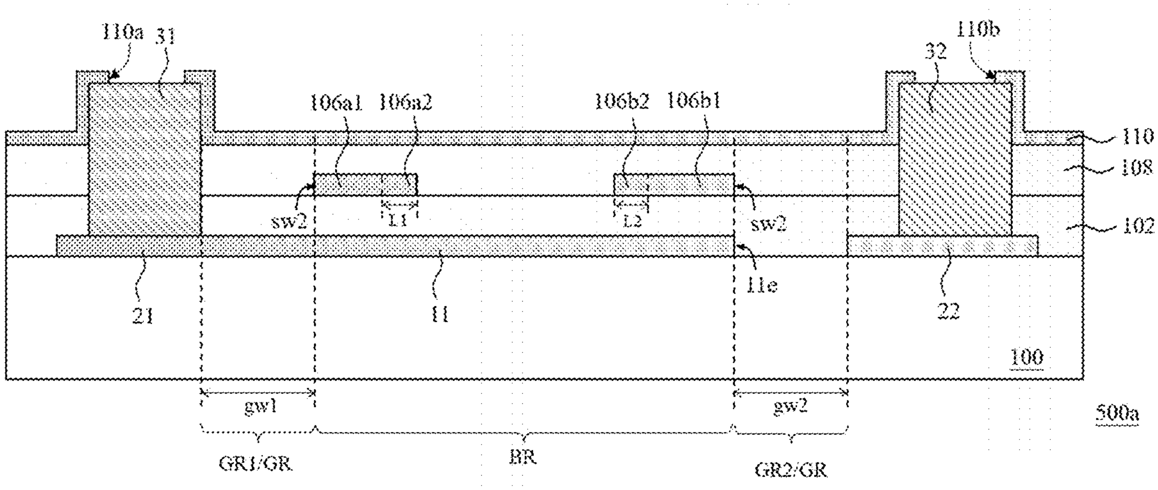
FIG. 2A illustrates a schematic cross-sectional view of a surface acoustic wave resonator device taken along line A-A' of FIG. 1A according to some embodiments of the present disclosure.
Figure 2B:
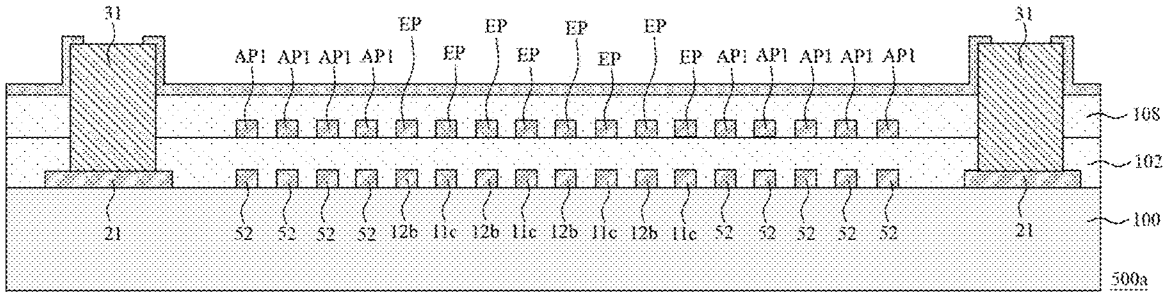
FIG. 2B illustrates a schematic cross-sectional view of a surface acoustic wave resonator device taken along line B-B' of FIG. 1A according to some embodiments of the present disclosure.
Figure 2C:
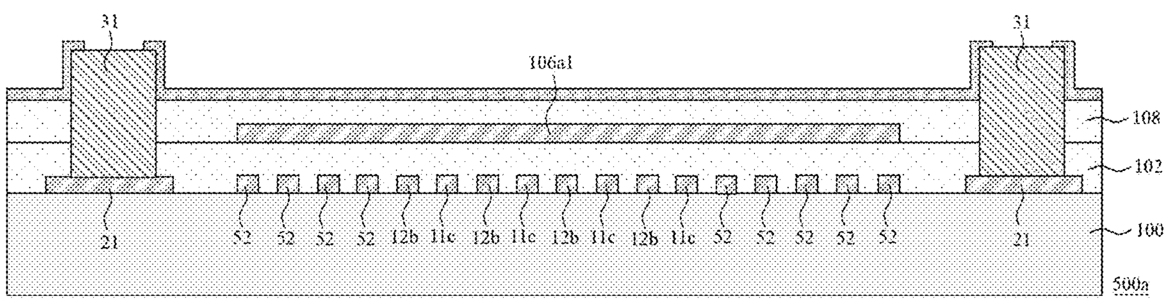
FIG. 2C illustrates a schematic cross-sectional view of a surface acoustic wave resonator device taken along line C-C' of FIG. 1A according to some embodiments of the present disclosure.

FIG. 1A illustrates a schematic top view of a surface acoustic wave resonator device according to some embodiments of the present disclosure. FIG. 1B illustrates a schematic enlarged top view of a region D of the surface acoustic wave resonator device of FIG. 1A according to some embodiments of the present disclosure. FIGS. 2A, 2B and 2C illustrate schematic cross-sectional views taken along line A-A', line B-B' and line C-C' of FIG. 1A, respectively.

Referring to FIGS. 1A, 1B and FIGS. 2A to 2C, in some embodiments, a surface acoustic wave resonator device 500*a* includes a piezoelectric substrate 100, an interdigital transducer (IDT) 101 and a conductive structure 106. The interdigital transducer 101 is disposed on a side of the piezoelectric substrate 100, and the conductive structure 106 is disposed on a side of the interdigital transducer 101 away from the piezoelectric substrate 100. The surface acoustic wave resonator device 500*a* has a body region BR and a peripheral region GR, and the peripheral region GR includes a first peripheral region GR1 and a second peripheral region GR2 located at two opposite sides of the body region BR in a first direction D1. For clarity of illustration, the conductive structure 106 is shown as transparent in the top view, but it should be understood that this does not mean that the conductive structure 106 is made of a transparent material. In some embodiments, the conductive structure 106 may include a metal structure and may be electrically floating. The conductive structure 106 serves as a clutter suppression structure and is configured to suppress or eliminate the clutter that may exist in the resonator device.

For example, the interdigital transducer 101 includes a plurality of interdigital electrodes, a first interdigital electrode lead-out part 12 and a second interdigital electrode lead-out part 22. The plurality of interdigital electrodes may include a first interdigital electrode 11 and a second interdigital electrode 12. The first interdigital electrode 11 and the first interdigital electrode lead-out part 12 are connected with each other and can jointly constitute a first interdigital electrode structure. The second interdigital electrode 12 and the second interdigital electrode lead-out part 22 are connected with each other and can jointly constitute a second interdigital electrode structure. In some embodiments, the interdigital electrode lead-out part may also be referred to as a busbar.

In some embodiments, a plurality of first interdigital electrodes 11 and a plurality of second interdigital electrodes 12 extend substantially parallel to each other along a first direction D1, and are alternately arranged and spaced apart from each other along a second direction D2. The first direction D1 and the second direction D2 are parallel to a main surface (for example, the surface close to the interdigital transducer 101) of the piezoelectric substrate 100, and intersect with each other, for example, they are substantially perpendicular to each other. The first interdigital electrode lead-out part 21 is located at a side of the plurality of first interdigital electrodes 11 in the first direction D1 and is connected to the plurality of first interdigital electrodes 11, so that the plurality of first interdigital electrodes 11 are electrically connected with each other through the first interdigital electrode lead-out part 21. Similarly, the second interdigital electrode lead-out part 22 is located at a side of the plurality of second interdigital electrodes 12 in the first direction D1 and is connected to the plurality of second interdigital electrodes 12, so that the plurality of second interdigital electrodes 12 are electrically connected with each other through the second interdigital electrode lead-out part 22.

The first interdigital electrode lead-out part 21 and the second interdigital electrode lead-out part 22 are located at two opposite sides of the body region BR in the first direction D1. For example, the first interdigital electrode lead-out part 21 is located at a side of the first peripheral region GR1 away from the body region BR in the first direction D1, and the second interdigital electrode lead-out part 22 is located at a side of the second peripheral region GR2 away from the body region BR in the first direction. That is, in an extending direction of the interdigital electrodes (for example, in the first direction D1), the first peripheral region GR1 is located between the body region BR and the first interdigital electrode lead-out part 21, and the second peripheral region GR2 is located between the body region BR and the second interdigital electrode lead-out part 22. Herein, the body region BR refers to a region in which the first interdigital electrodes 11 and the second interdigital electrodes 12 completely overlap with each other in an arrangement direction of the interdigital electrodes (for example, in the second direction D2); in the peripheral region, the first interdigital electrode and the second interdigital electrode do not overlap with each other in the second direction. The body region BR and the peripheral region GR each include not only a layer where the interdigital transducer is located, but also layer(s) overlapping with the interdigital transducer in a direction perpendicular to the main surface of the piezoelectric substrate. Herein, multiple components being overlapped in a certain direction represents that orthographic projections of the multiple components on a reference plane perpendicular to the certain direction overlap with each other. That is, in the body region BR, orthographic projections of the first interdigital electrodes 11 and the second interdigital electrodes 12 on a reference plane (for example, a surface of a reflecting grating 102 close to the interdigital transducer) perpendicular to the second direction D2 completely overlap with each other.

Still referring to FIG. 1A and FIG. 1B, the first interdigital electrode 11 is located in the body region BR, and extends from the body region BR across the first peripheral region GR1 to be connected to the first interdigital electrode lead-out part 21. The second interdigital electrode 12 is located in the body region BR, and extends from the body region BR across the second peripheral region GR2 to be connected to the second interdigital electrode lead-out part 22. The first interdigital electrode 11 has a first electrode edge 11*e*, which is away from the first interdigital electrode lead-out part 21 and faces the second interdigital electrode lead-out part 22 in the first direction D1, and is spaced apart from the second interdigital electrode lead-out part 22 by the second peripheral region GR2. The second interdigital electrode 12 has a second electrode edge 12*e*, which is away from the second interdigital electrode lead-out part 22 and faces the first interdigital electrode lead-out part 21 in the first direction D1, and is spaced apart from the first interdigital electrode lead-out part 21 by the first peripheral region GR1.

The peripheral region GR may be defined by the corresponding electrode edge and the surface of the interdigital electrode lead-out part facing the electrode edge. For example, the first peripheral region GR1 may include a region located, in the first direction D1, between an expanded plane where the second electrode edge 12*e* expands along the second direction D2 and a third direction D3 and an expanded plane where the surface of the first interdigital electrode lead-out part 21 facing the second electrode edge 12*e* expands along the second direction D2 and the third direction D3. The second peripheral region GR2 may include a region located, in the first direction D1, between an expanded plane where the first electrode edge 11*e* expands along the second direction D2 and the third direction D3 and an expanded plane where the surface of the second interdigital electrode lead-out part 22 facing the first electrode edge 11*e* expands along the second direction D2 and the third direction D3. The third direction D3 is perpendicular to the main surface 100 of the piezoelectric substrate 100, and may be perpendicular to the first direction D1 and the second direction D2.

In some embodiments, the body region BR includes a central region C, and a first end region E1 and a second end region E2 located at two opposite sides of the central region C in the first direction D1; the first end region E1 is located between the central region C and the first peripheral region GR1, and the second end region E2 is located between the central region C and the second peripheral region GR2. The first interdigital electrode 11 and the second interdigital electrode 12 each include a central part, a first end part, a second end part and a connecting part. In each interdigital electrode, the first end part and the second end part are located at two opposite sides of the central part in the first direction, and the connecting part is located at a side of the second end part away from the central part and is connected to a corresponding one of the first interdigital electrode lead-out part and the second interdigital electrode lead-out part. In each interdigital electrode, the central part is located in the central region C, and the first end part is located in one of the first end region E1 and the second end region E2; the second end part is located in the other one of the first end region E1 and the second end region E2, and the connecting part is located in one of the first peripheral region GR1 and the second peripheral region GR2, wherein the first end part and the second end part can be collectively referred to as end portions of the interdigital electrode; the first end region E1 and the second end region E2 may be collectively referred to as end regions. It should be understood that, the central part, the first end part, the second end part and the connecting part of each interdigital electrode are connected with each other and are continuous, and may be integrally formed. In some embodiments, in each interdigital electrode structure, the interdigital electrode and the interdigital electrode lead-out part may also be integrally formed.

For example, as shown in FIG. 1B, the first interdigital electrode 11 includes a central part 11*a* located in the central region C, a first end part 11*b* located in the second end region E2, a second end part 11*c* located in the first end region E1, and a connecting part 11*d* located in the first peripheral region GR1. The second interdigital electrode 12 includes a central part 12*a* located in the central region, a first end part 12*b* located in the first end region E1, a second end part 12*c* located in the second end region E2, and a connecting part 12*d* located in the second peripheral region GR2. The central part 11*a* of the first interdigital electrode 11 and the central part 12*a* of the second interdigital electrode 12 overlap (for example, completely overlap) with each other in the second direction D2; the first end part 11*b* of the first interdigital electrode 11 and the second end part 12*c* of the second interdigital electrode 12 overlap (for example, completely overlap) with each other in the second direction D2; and the second end part 11*c* of the first interdigital electrode 11 and the first end part 12*b* of the second interdigital electrode 12 overlap (for example, completely overlap) with each other in the second direction D2. The connecting part 11*d* of the first interdigital electrode 11 is located in the first peripheral region GR1 and does not overlap with the second interdigital electrode 12 in the second direction D2; the connecting part 12*d* of the second interdigital electrode 12 is located in the second peripheral region GR2 and does not overlap with the first interdigital electrode 11 in the second direction D2.

In some embodiments, the conductive structure 106 is disposed, at least in the end regions, on a side of the interdigital transducer away from the piezoelectric substrate 100, and at least overlaps with end portions of a plurality of interdigital electrodes close to the first peripheral region GR1 and the second peripheral region GR2 in a third direction D3 perpendicular to a main surface of the piezoelectric substrate. The conductive structure 106 may at least include a body structure BP and a first sawtooth structure SP1, wherein the body structure BP continuously extends across the plurality of interdigital electrodes in a second direction D2, the first sawtooth structure SP1 is located at a side of the body structure BP away from the peripheral region GR in the first direction D1, and at least a portion of the body structure BP and the first sawtooth structure SP1 overlap with end portions of the plurality of interdigital electrodes in the third direction D3.

Referring to FIG. 1A and FIG. 1B, in some embodiments, the body structure BP overlaps with the plurality of interdigital electrodes in the third direction D3, and overlaps with gaps between adjacent interdigital electrodes (e.g., adjacent first and second interdigital electrodes) among the plurality of interdigital electrodes. In some embodiments, the first sawtooth structure SP1 does not overlap with the gap between adjacent interdigital electrodes in the third direction; that is, an orthographic projection of the first sawtooth structure SP1 on the piezoelectric substrate 100 is offset from an orthographic projection of the gap between adjacent interdigital electrodes on the piezoelectric substrate 100. For example, the orthographic projection of the first sawtooth structure SP1 on the piezoelectric substrate 100 may be located within a range of orthographic projections of the plurality of interdigital electrodes on the piezoelectric substrate 100. In some embodiments, the first sawtooth structure may be entirely located in the end regions, and the body structure may also be entirely located in the end regions.

Referring to FIG. 1A, FIG. 1B and FIG. 2A to FIG. 2C, in some embodiments, the conductive structure 106 includes a first conductive layer 106*a* and a second conductive layer 106*b* disposed side by side in the first direction D1. The first conductive layer 106*a* and the second conductive layer 106*b* are at least located in a first end region E1 and a second end region E2, respectively, and at least overlap with end portions of the plurality of interdigital electrodes close to the first peripheral region and the second peripheral region in the third direction, respectively. Specifically, the first conductive layer 106*a* overlaps with at least second end parts 11*c* of a plurality of first interdigital electrodes 11 and first end parts 12*b* of a plurality of second interdigital electrodes 12 in the third direction D3. The second conductive layer 106*b* overlaps with at least first end parts 11*b* of the plurality of first interdigital electrodes 11 and second end parts 12*d* of the plurality of second interdigital electrodes 12 in the third direction D3. In some other embodiments, the first conductive layer 106*a* may also overlap with portions of connecting parts 11*d* of the plurality of first interdigital electrodes 11 in the third direction D3, and the second conductive layer 106*b* may also overlap with portions of connecting parts 12*d* of the plurality of second interdigital electrodes 12 in the third direction D3.

In some embodiments, orthographic projections of end portions (i.e., the second end parts 11*c* of the first interdigital electrodes 11 and the first end parts 12*b* of the second interdigital electrodes 12) of a plurality of interdigital electrodes close to the first peripheral region GR1 on the piezoelectric substrate 100 are located within a range of an orthographic projection of the first conductive layer 106*a* on the piezoelectric substrate 100. Orthographic projections of end portions (i.e., the first end parts 11*b* of the first interdigital electrodes 11 and the second end parts 12*c* of the second interdigital electrodes 12) of a plurality of interdigital electrodes close to the second peripheral region GR2 on the piezoelectric substrate 100 are located within a range of an orthographic projection of the second conductive layer 106*b* on the piezoelectric substrate 100.

During the operation of the surface acoustic wave resonator structure, the surface acoustic wave propagates along the arrangement direction (for example, the second direction D2) of the plurality of interdigital electrodes of the interdigital transducer 101. However, there may also exist some clutters propagating along the extension direction (for example, the first direction D1) of the interdigital electrodes, and such clutters will cause energy loss, which will further lead to the degradation of the performance of the resonator/filter. In the embodiment of the present disclosure, by disposing a conductive structure including a first conductive layer and a second conductive layer above the end portions and/or the connecting parts of a plurality of interdigital electrodes, the conductive structure can generate a region or an interface where acoustic wave propagation impedance is changed, and can thus be served as a clutter suppression structure to suppress or eliminate the clutters propagating in the first direction D1 and can reflect the clutters propagating in the first direction D1 back into the resonator, thereby reducing or avoiding energy loss. In some embodiments, the clutter suppression capability of the conductive structure mainly depends on a part thereof overlapping with the plurality of interdigital electrodes. Therefore, by increasing the overlapping area of the conductive structure and the plurality of interdigital electrodes, the clutter suppression capability of the conductive structure can be improved. Here, the overlapping area of the conductive structure and the plurality of interdigital electrodes refers to the area of the part of the orthographic projection of the conductive structure on the piezoelectric substrate overlapping with the orthographic projections of the plurality of interdigital electrodes on the piezoelectric substrate.

Referring to FIG. 1A, FIG. 1B and FIG. 2A to FIG. 2C, in some embodiments, the first conductive layer 106*a* includes a first body part 106*a*1 and a first sawtooth part

106a2 connected with each other. The second conductive layer 106b includes a second body part 106b1 and a second sawtooth part 106b2 connected with each other. The first body part 106a1 and the second body part 106b1 together constitute a body structure BP.

For example, the first body part 106a1 and the second body part 106b1 may extend continuously in the second direction D2 and substantially parallel to each other, and each extend across a plurality of interdigital electrodes. Each body part of the first body part 106a1 and the second body part 106b1 overlaps with a plurality of interdigital electrodes in the third direction D3, and overlaps with a gap between adjacent interdigital electrodes among the plurality of interdigital electrodes. The first body part 106a1 and the second body part 106b1 each have a first sidewall sw1 and a second sidewall sw2 opposite to each other in the first direction D1. The first sidewall sw1 is the sidewall of the respective body part close to the central region C and away from the peripheral region, and the second sidewall sw2 is the sidewall of the respective body part close to the corresponding peripheral region.

In some embodiments, the first sawtooth part 106a2 at least includes a first internal sawtooth IS1, which is located at a side of the first body part 106a1 away from the first peripheral region GR1 in the first direction D1. The second sawtooth part 106b2 at least includes a second internal sawtooth IS2, which is located at a side of the second body part 106b1 away from the second peripheral region GR2 in the first direction D1. The first internal sawtooth IS1 and the second internal sawtooth IS2 together constitute the first sawtooth structure SP1.

In some embodiments, the first internal sawtooth IS1 and the second internal sawtooth IS2 each include a plurality of internal extension parts EP protruding from the first sidewall sw1 of the corresponding body part in the first direction D1; and in each of the first internal sawtooth IS1 and the second internal sawtooth IS2, the plurality of internal extension parts EP may extend in the first direction D1 substantially parallel to each other, and are arranged at intervals along the second direction D2, and overlap with a plurality of interdigital electrodes in the third direction D3, respectively; for example, in each internal sawtooth, the plurality of internal extension parts EP may be disposed in one-to-one correspondence with the plurality of interdigital electrodes (including a plurality of first interdigital electrodes 11 and a plurality of second interdigital electrodes 12), and each internal extension part EP may overlap with a corresponding one of the plurality of interdigital electrodes in the third direction D3. In the internal extension part EP and the interdigital electrode (e.g., the first interdigital electrode 11 or the second interdigital electrode 12) overlapping with each other, an orthographic projection of the internal extension part EP on the piezoelectric substrate 100 may be located within a range of an orthographic projection of the corresponding interdigital electrode on the piezoelectric substrate 100.

In each of the first and second internal sawtooth IS1 and IS2, in the second direction D2, a spacing s1 between adjacent internal extension parts EP among the plurality of internal extension parts EP may be greater than or substantially equal to a spacing s2 between adjacent interdigital electrodes. In some embodiments, in the internal extension part EP and the interdigital electrode overlapping with each other, a width of the internal extension part EP in the second direction D2 may be substantially equal to or different from a width of the interdigital electrode in the second direction D2; for example, the width of the internal extension part EP in the second direction D2 may be substantially equal to the width of the interdigital electrode in the second direction D2. In the third direction D3 perpendicular to the main surface of the piezoelectric substrate, two sidewalls of the internal extension part EP opposite to each other in the second direction D2 may be substantially aligned with portions of two sidewalls of the interdigital electrode opposite to each other in the second direction D2. In some other embodiments, in the internal extension part EP and the interdigital electrode overlapping with each other, the width of the internal extension part EP in the second direction D2 may also be smaller than the width of the interdigital electrode in the second direction D2. The two sidewalls of the internal extension part EP opposite to each other in the second direction D2 may also be offset, in the second direction D2, from the two sidewalls of the corresponding interdigital electrode opposite to each other in the second direction D2.

Referring to FIG. 1A, FIG. 1B and FIG. 2A, in some embodiments, the second sidewall sw2 of the first body part 106a1 close to the first peripheral region GR1 may be substantially aligned with a second electrode edge 12e of the second interdigital electrode 12 in the third direction D3. The second sidewall sw2 of the second body part 106b1 close to the second peripheral region GR2 may be substantially aligned with a first electrode edge 11e of the first interdigital electrode 11 in the third direction D3. That is, the conductive structure 106 may be entirely disposed in the end regions, without extending into the peripheral regions. In this example, the conductive structure 106 overlaps with the end portions of the plurality of interdigital electrodes in the third direction, but may not overlap with the connecting parts of the plurality of interdigital electrodes.

Referring to FIG. 1B, in some embodiments, a peripheral width of each peripheral region is defined by a distance between the corresponding electrode edge and the interdigital electrode lead-out part in the first direction. For example, the first peripheral region GR1 has a first peripheral width gw1, which is defined by a distance between the second electrode edge 12e and the first interdigital electrode lead-out part 21 in the first direction D1, that is, substantially equal to a distance between the second electrode edge 12e and the surface of the first interdigital electrode lead-out part 21 facing the second electrode edge 12e in the first direction D1. The second peripheral region GR2 has a second peripheral width gw2, which is defined by a distance between the first electrode edge 11e and the second interdigital electrode lead-out part 22 in the first direction D1, that is, substantially equal to a distance between the first electrode edge 11e and the surface of the second interdigital electrode lead-out part 22 facing the first electrode edge 11e in the first direction D1.

In this embodiment, in the first direction D1, a distance d1 between the second sidewall sw2 of the first body part 106a1 and the first interdigital electrode lead-out part 21 is substantially equal to the first peripheral width gw1, and a distance d2 between the second sidewall sw2 of the second body part 106b1 and the second interdigital electrode lead-out part 22 is substantially equal to the second peripheral width gw2. However, the present disclosure is not limited thereto.

In some embodiments, a width L1 of the first internal sawtooth IS1 in the first direction D1 (that is, an extension length of its internal extension part EP in the first direction D1) is smaller than or equal to 20% of the first peripheral width gw1; a width L2 of the second internal sawtooth IS2 in the first direction D1 (that is, an extension length of its internal extension part EP in the first direction D1) is smaller than or equal to 20% of the second peripheral width gw2. In the same internal sawtooth or different internal sawteeth, the extension lengths of the plurality of internal extension parts EP may be equal to or different from each other, and the extension length of each internal extension part EP in the first direction may be within 20% of the corresponding first peripheral width gw1 or second peripheral width gw2.

In some embodiments, a range of the first peripheral width gw1 and a range of the second peripheral width gw2 may each be within 0.1 to 2 times of a wavelength. A width W1 of the first body part 106*a*1 and a width W2 of the second body part 106*b*1 may each be set within 0.25 to 0.5 times of the wavelength. The width L1 of the first internal sawtooth IS1 and the width L2 of the second internal sawtooth IS2 may each be set within 0.1 to 0.5 times of the wavelength. It should be understood that the wavelength here refers to a working wavelength of the resonator device, which is equal to a ratio of a sound speed to a frequency (i.e., a resonant frequency of the resonator device), i.e., wavelength=sound speed-frequency.

In some embodiments, as shown in FIG. 1B and FIG. 2A, in the conductive structure, a thickness of the body part and a thickness of the sawtooth part in the direction perpendicular to the main surface of the piezoelectric substrate may be substantially equal to or different from each other. In some embodiments, a normalized thickness of each body part may range from about 0.03 to 0.12, and a normalized thickness of each sawtooth part may range from about 0.03 to 0.12. Here, normalized thickness=equivalent film thickness÷wavelength.

In some embodiments, the width W1 of the first body part 106*a*1 may be equal to or different from the width L1 of the first internal sawtooth IS1, and the width W2 of the second body part 106*b*1 may be equal to or different from the width L2 of the second internal sawtooth IS2. For example, the width W1 of the first body part 106*a*1 may be greater than, equal to or smaller than the width L1 of the first internal sawtooth IS1; the width W2 of the second body part 106*b*1 may be greater than, equal to or smaller than the width L2 of the second internal sawtooth IS2.

Referring to FIG. 1A, FIG. 1B, and FIG. 2A to FIG. 2C, in some embodiments, the surface acoustic wave resonator device 500*a* further includes a reflecting grating 102*a* and a reflecting grating 102*b* (collectively referred to as reflecting gratings 102). The reflecting gratings 102 and the interdigital transducer 101 may be disposed in the same layer. That is, the reflecting gratings 102 and the interdigital transducer 101 may be formed from the same one material layer through the same one patterning process, but the present disclosure is not limited thereto.

The reflecting grating 102*a* and the reflecting grating 102*b* are disposed on two opposite sides of the interdigital transducer 101 in the second direction D2, and each reflecting grating includes a plurality of reflective electrodes 52 and a busbar 53. For example, in each reflecting grating, the plurality of reflective electrodes 52 extend along the first direction D1 substantially parallel to each other and are arranged at intervals along the second direction D2, and the busbar 53 extends along the second direction D2 and is connected to the plurality of reflective electrodes 52. For example, two busbars 53 are located on two opposite sides of the plurality of reflective electrodes 52 in the first direction D1, and may be substantially parallel to each other, and each electrically connected to the plurality of reflective electrodes 52. The number of the reflective electrodes 52 in the reflecting grating 102*a* may be as same as or different from the number of the reflective electrodes 52 in the reflecting grating 102*b*. It should be understood that, the number of the first interdigital electrodes, the number of the second interdigital electrodes and the number of the reflective electrodes in the reflecting grating shown in the drawings are only for illustration, and the present disclosure is not limited thereto.

In some embodiments, the conductive structure 106 may further extend to a region where a reflecting grating 102 is located, and the conductive structure 106 may also partially overlap with the reflecting grating 102 in the third direction D3 perpendicular to the main surface of the piezoelectric substrate 100, for example, partially overlapping with a plurality of reflective electrodes 52.

For example, the conductive structure 106 has a central region CR and an additional region AR; in the central region CR, the conductive structure 106 overlaps with a plurality of interdigital electrodes in the third direction D3; in the additional region AR, the conductive structure 106 overlaps with the reflecting grating 102 (for example, a plurality of reflective electrodes 52 thereof) in the third direction D3. For example, in each conductive layer, two additional regions AR are disposed on two opposite sides of the central region CR in the second direction D2, and may be disposed in one-to-one correspondence with two reflecting gratings 102. The structure of each conductive layer in the additional region AR may be similar to that in the central region CR, that is, the conductive structure is also provided with a body part and a sawtooth part in the additional region AR.

For example, in the conductive structure 106, the first body part 106*a*1 and the second body part 106*b*1 each extend continuously from the central region CR to the additional region AR in the second direction D2, and extend continuously across a plurality of interdigital electrodes of the interdigital transducer and a plurality of reflective electrodes 52 of the reflecting grating 102. That is, in the third direction D3 perpendicular to the main surface of the piezoelectric substrate, the first body part 106*a*1 and the second body part 106*b*1 may each overlap with a plurality of interdigital electrodes of the interdigital transducer and a plurality of reflective electrodes 52 of the reflecting grating 102, and may each overlap with a gap region between adjacent interdigital electrodes, a gap region between adjacent reflective electrodes and a gap region between adjacent interdigital electrode and reflective electrode.

In some embodiments, in the additional region of the conductive structure, an additional sawtooth structure may be further included. For example, the first conductive layer further includes a first additional sawtooth structure, which is located at one side or two opposite sides of the first body part in the first direction; the second conductive layer further includes a second additional sawtooth structure, which is located at one side or two opposite sides of the second body part in the second direction.

In some embodiments, the first additional sawtooth structure includes at least one of a first additional internal extension part and a first additional external extension part, wherein the first additional internal extension part protrudes from the first sidewall of the first body part in the first direction away from the first peripheral region, and the second additional external extension part protrudes from the second sidewall of the first body part in the first direction towards the first peripheral region; the second additional sawtooth structure includes at least one of a second additional internal extension part and a second additional external extension part, wherein the second additional internal extension part protrudes from the first sidewall of the second body part in the first direction away from the second peripheral region, and the second additional external extension part protrudes from the second sidewall of the second body part in the first direction towards the second peripheral region. In some embodiments, an orthographic projection of the additional sawtooth structure (i.e., the first additional sawtooth structure and/or the second additional sawtooth structure) on the piezoelectric substrate is located within a range of an orthographic projection of the reflecting gratings on the piezoelectric substrate.

For example, as shown in FIG. 1A, the first conductive layer 106*a* further includes a first additional sawtooth structure AS1, which is located at a side of the first body part 106*a*1 in the first direction D1 and may be located at one side or two opposite sides of the first internal sawtooth IS1 in the second direction D2. The second conductive layer 106*b* further includes a second additional sawtooth structure AS2, which is located at a side of the second body part 106*b*1 in the first direction D1 and may be located at one side or two opposite sides of the second internal sawtooth IS2 in the second direction D2.

For example, the first additional sawtooth structure AS1 includes a plurality of first additional internal extension parts AP1 protruding from the first sidewall sw1 of the first body part 106*a*1 in the first direction D1 away from the first peripheral region GR1. The second additional sawtooth structure AS2 includes a plurality of second additional internal extension parts AP2 protruding from the first sidewall sw1 of the second body part 106*b*1 in the first direction D1 away from the second peripheral region GR2.

In each additional region of the first conductive layer, the plurality of first additional internal extension parts AP1 are arranged at intervals along the second direction D2, and may be disposed in one-to-one correspondence with a plurality of reflective electrodes 52 and overlap with the plurality of reflective electrodes 52 in the third direction D3, respectively. The number of the plurality of first additional internal extension parts AP1 may be equal to or different from the number of the plurality of reflective electrodes 52. In each additional region of the second conductive layer, the plurality of second additional internal extension parts AP2 may be disposed in one-to-one correspondence with a plurality of reflective electrodes 52, and overlap with the plurality of reflective electrodes 52 in the third direction D3 perpendicular to the main surface of the piezoelectric substrate, respectively. The number of the plurality of second additional internal extension parts AP2 may be equal to or different from the number of the plurality of reflective electrodes 52.

In some embodiments, in each additional sawtooth structure, an orthographic projection of the additional internal extension part on the piezoelectric substrate may be located within a range of an orthographic projection of the reflecting grating (e.g., the reflective electrode thereof) on the piezoelectric substrate. For example, in the second direction D2, a spacing between adjacent additional internal extension parts may be substantially equal to a spacing between adjacent reflective electrodes 52; in the reflective electrode and the additional internal extension part overlapping with each other in the third direction, a width of the additional internal extension part may be substantially equal to a width of the corresponding reflective electrode; two sidewalls of the additional internal extension part opposite to each other in the second direction D2 may be substantially aligned, in the third direction, with two sidewalls of the reflective electrode opposite to each other in the second direction D2, respectively. In an alternative embodiment, in the second direction D2, the spacing between adjacent additional internal extension parts may also be greater than the spacing between adjacent reflective electrodes 52, and the width of the additional internal extension part may be smaller than the width of the corresponding reflective electrode.

In some other embodiments, the conductive structure may be only disposed in the region where the interdigital transducer is located, and does not extend to the region where the reflecting grating is located. That is, the additional region AP of the conductive structure may be omitted.

Referring to FIG. 2A to FIG. 2C, in some embodiments, the surface acoustic wave resonator device 500*a* further includes a dielectric layer 102, the dielectric layer 102 is disposed on the piezoelectric substrate 100 and covers the interdigital transducer 101, for example, may cover at least sidewalls of a plurality of interdigital electrodes and surfaces of the plurality of interdigital electrodes at a side away from the piezoelectric substrate 100, or may further cover sidewalls of a plurality of interdigital electrode lead-out parts and surfaces of the plurality of interdigital electrode lead-out parts at a side away from the piezoelectric substrate 100. The dielectric layer 102 may further cover the reflecting grating 102, for example, may cover sidewalls of a plurality of reflective electrodes and/or a busbar of the reflecting grating and surfaces of the plurality of reflective electrodes and/or the busbar at a side away from the piezoelectric substrate 100. In some embodiments, the conductive structure 106 is located on a side of the dielectric layer 102 away from the piezoelectric substrate 100; that is, a portion of the dielectric layer 102 is located between the conductive structure 106 and the interdigital electrodes in the third direction D3 perpendicular to the main surface of the piezoelectric substrate, and separates the conductive structure 106 from the interdigital electrodes. In some embodiments, the surface acoustic wave resonator device 500*a* may further include a dielectric layer 108, the dielectric layer 108 is disposed on a side of the dielectric layer 102 away from the piezoelectric substrate 100, and may cover the sidewalls of the conductive structure 106 and the surface of the conductive structure 106 at a side away from the piezoelectric substrate. The dielectric layer 102 and the dielectric layer 108 may be used as temperature compensation layers, and may include temperature compensation materials such as silicon oxide. The dielectric layer 102 and the dielectric layer 108 may together constitute a temperature compensation structure. In some embodiments, the dielectric layer 108 may also be omitted, that is, the temperature compensation structure may only include the dielectric layer 102.

In some embodiments, the surface acoustic wave resonator device 500*a* may further include a first conductive connector 31, a second conductive connector 32, and a passivation layer 110. For example, the first conductive connector 31 extends through the dielectric layers 108 and 102 to be electrically connected to the first interdigital electrode lead-out part 21; the second conductive connector 32 extends through the dielectric layers 108 and 102 to be electrically connected to the second interdigital electrode lead-out part 22.

The passivation layer 110 may be disposed on a side of the temperature compensation structure away from the piezoelectric substrate, for example, on a side of the dielectric layer 108 away from the piezoelectric substrate 100, and cover portions of surfaces of the first conductive connector 31 and the second conductive connector 32. For example, the passivation layer 110 may cover the sidewalls of the first conductive connector 31 and the second conductive connector 32, and portions of surfaces of the first conductive connector 31 and the second conductive connector 32 away from the piezoelectric substrate. The passivation layer 110 may have a plurality of openings, including, for example, a first passivation opening 110*a* and a second passivation opening 110*b*, which respectively expose portions of surfaces of the first conductive connector 31 and the second conductive connector 32 at a side away from the piezoelectric substrate 100, so as to provide external connection windows. In some embodiments, the dielectric layer 108 may be omitted, and the passivation layer 110 may be formed on a side of the dielectric layer 102 away from the piezoelectric substrate 100 and cover the clutter suppression structure 106, but the present disclosure is not limited thereto.

For the convenience of understanding, in the cross-sectional views of FIGS. 2A to 2C, the structure of the passivation openings in the cross-sectional view is schematically shown, but the positions of the passivation openings in FIGS. 2A to 2C may not completely correspond to the positions of the passivation openings in FIG. 1A. It should be understood that, the positions of the passivation openings can be appropriately adjusted and configured according to product designs and requirements.

In the surface acoustic wave resonator device 500*a*, the entire conductive structure 106 is disposed in the end regions; and the second sidewall sw2 of the body structure BP has a part aligned with the electrode edge of the corresponding interdigital electrode, but the present disclosure is not limited to this. In an alternative embodiment, the second sidewall sw2 of the body structure BP may also be offset in the first direction D1 with respect to the electrode edge of the corresponding interdigital electrode.

Figure 3A:
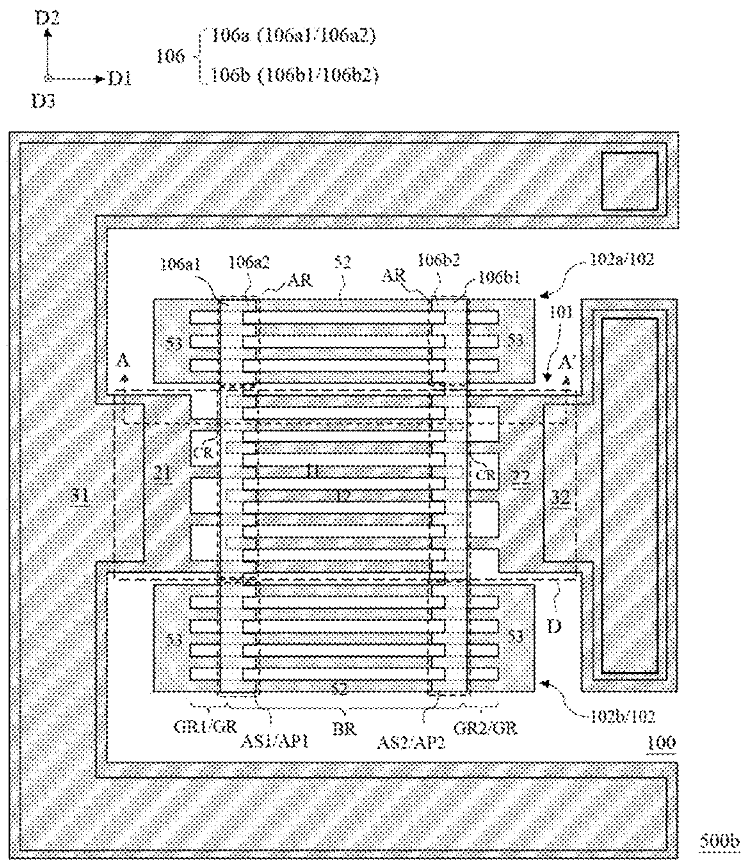
FIG. 3A illustrates a schematic top view of a surface acoustic wave resonator device according to some alternative embodiments of the present disclosure.
Figure 3B:
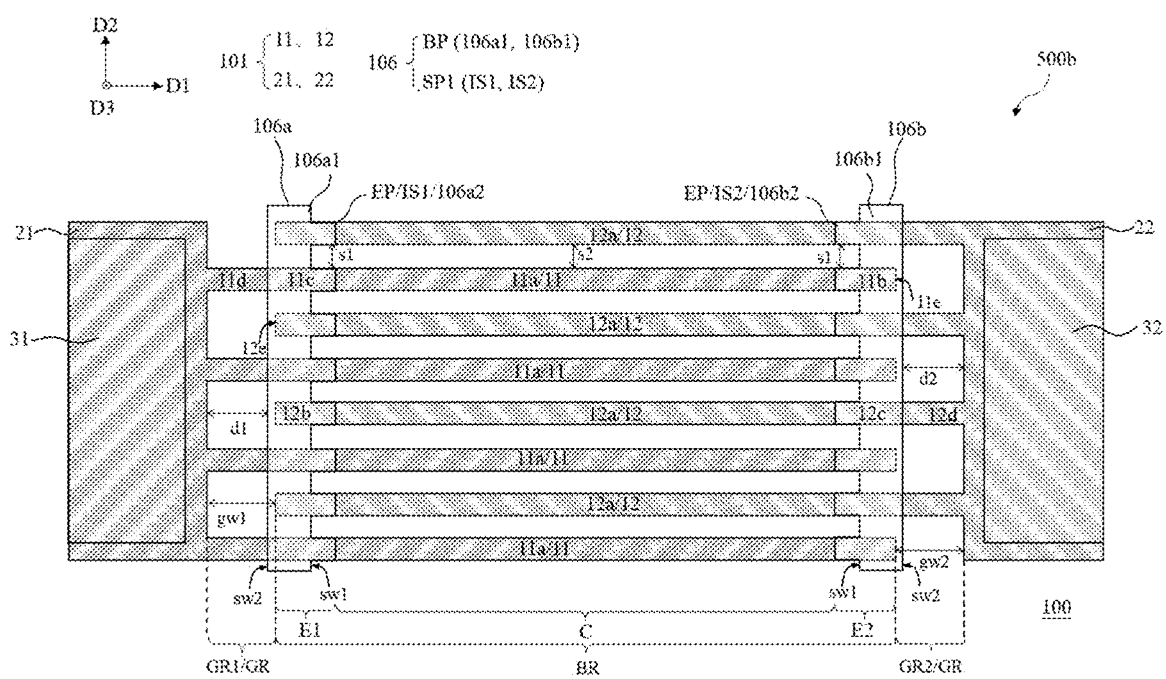
FIG. 3B illustrates a schematic enlarged top view of a partial region of the surface acoustic wave resonator device shown in FIG. 3A according to some alternative embodiments of the present disclosure.

FIG. 3A illustrates a schematic top view of a surface acoustic wave resonator device 500*b* according to some other embodiments of the present disclosure; FIG. 3B illustrates a schematic enlarged top view of region D of FIG. 3A. The surface acoustic wave resonator device 500*b* is similar to the surface acoustic wave resonator device 500*a*, with the difference that the second sidewall of the body structure of the conductive structure in the surface acoustic wave resonator device 500*b* is offset towards the peripheral region and the interdigital electrode lead-out part with respect to the electrode edge of the corresponding interdigital electrode, and the body structure further overlaps with the connecting part of the corresponding interdigital electrode in the third direction.

Referring to FIG. 3A and FIG. 3B, in some embodiments, in the first conductive layer 106*a*, the first body part 106*a*1 extends beyond the second electrode edge 12*e* of the second interdigital electrode 12 in the first direction D1, and has a part located in the first peripheral region GR1. That is, the second sidewall sw2 of the first body part 106*a*1 is offset in the first direction D1 towards the first interdigital electrode lead-out part 21 with respect to the second electrode edge 12*e* of the second interdigital electrode 12. In the first direction D1, a distance d1 between the second sidewall sw2 of the first body part 106*a*1 and the first interdigital electrode lead-out part 21 is smaller than the first peripheral width gw1. A portion of the first body part 106*a*1 located in the first peripheral region GR1 overlaps with portions of connecting parts 11*d* of a plurality of first interdigital electrodes 11 in the third direction. For example, orthographic projections of portions of the connecting parts 11*d* of the plurality of first interdigital electrodes 11 on the piezoelectric substrate 100 are also located within a range of the orthographic projection of the first conductive layer 106*a* (for example, the first body part 106*a*1 thereof) on the piezoelectric substrate 100.

In some embodiments, in the second conductive layer 106*b*, the second body part 106*b*1 extends beyond the first electrode edge 11*e* of the first interdigital electrode 11 in the first direction D1, and has a portion located in the second peripheral region GR2. That is, the second sidewall sw2 of the second body part 106*b*1 is offset in the first direction D1 towards the second interdigital electrode lead-out part 22 with respect to the first electrode edge 11*e* of the first interdigital electrode 11. A distance d2 between the second sidewall sw2 of the second body part 106*b*1 and the second interdigital electrode lead-out part 22 in the first direction D1 is smaller than the second peripheral width gw2. A portion of the second body part 106*b*1 located in the second peripheral region GR2 overlaps with portions of connecting parts 12*d* of a plurality of second interdigital electrodes 12 in the third direction. For example, orthographic projections of portions of the connecting parts 12*d* of the plurality of second interdigital electrodes 12 on the piezoelectric substrate 100 are also located within a range of the orthographic projection of the second conductive layer 106*b* (for example, the second body part 106*b*1) on the piezoelectric substrate 100. It should be understood that the distances d1 and d2 are non-zero distances.

In the embodiment where the second sidewall of the body structure is offset in the first direction with respect to the electrode edge of the corresponding electrode, the widths in the first direction of the body part and the sawtooth part in each conductive layer can be appropriately adjusted according to the product designs and needs so as to satisfy the product requirements and ensure the clutter suppression capability of the conductive structure. In various embodiments of the present disclosure, the first sawtooth structure including the first internal sawtooth and the second internal sawtooth may be entirely disposed in the end region.

Figure 4A:
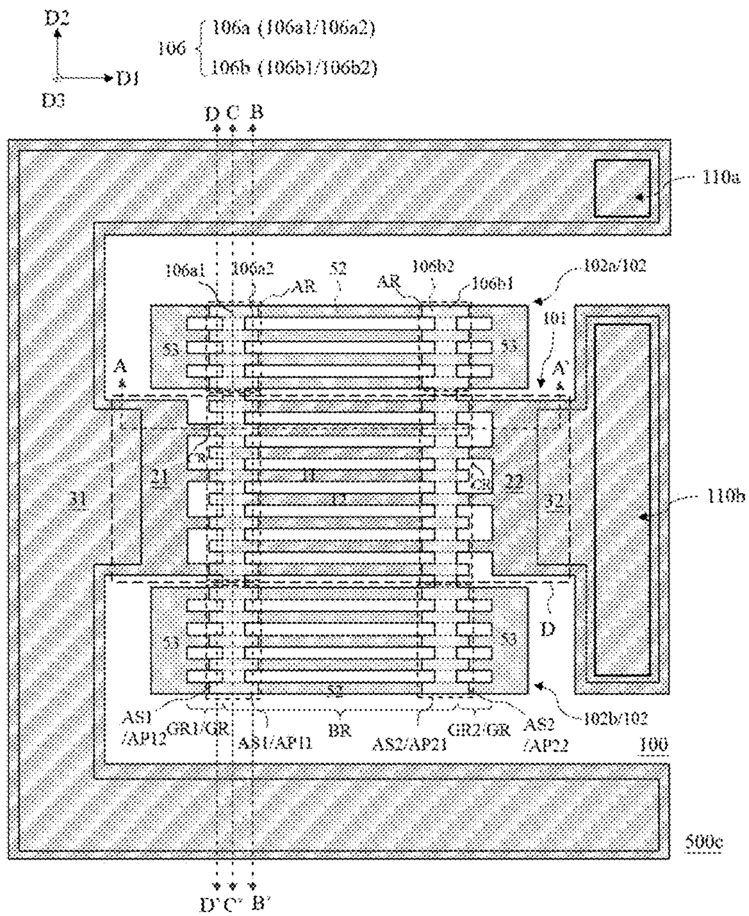
FIG. 4A illustrates a schematic top view of a surface acoustic wave resonator device according to some other embodiments of the present disclosure.
Figure 4B:
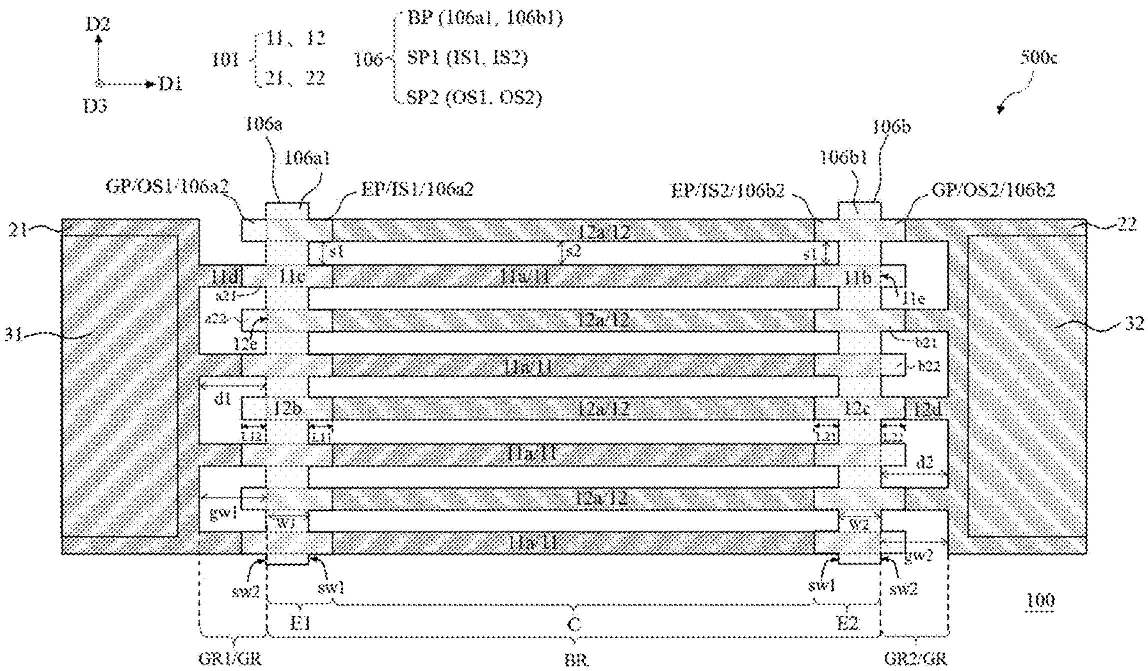
FIG. 4B illustrates a schematic enlarged top view of a partial region of the surface acoustic wave resonator device shown in FIG. 4A according to some other embodiments of the present disclosure.

FIG. 4A illustrates a schematic top view of a surface acoustic wave resonator device 500*c* according to some other embodiments of the present disclosure; FIG. 4B illustrates a schematic enlarged top view of region D of FIG. 4A. FIGS. 5A, 5B, 5C and 5D respectively illustrate schematic cross-sectional views of the surface acoustic wave resonator device 500*c* taken along line A-A', line B-B', line C-C' and line D-D' of FIG. 4A according to some other embodiments of the present disclosure. The surface acoustic wave resonator device 500*c* is similar to the surface acoustic wave resonator device 500*a*, with the difference that the conductive structure of the surface acoustic wave resonator device 500*c* further includes a second sawtooth structure.

In the embodiment where the conductive structure further includes a second sawtooth structure, the structural features of the first sawtooth structure of the conductive structure are similar to those of the previous embodiment, and will not be described again here. In some embodiments, the first sawtooth structure is entirely disposed in the end regions, and does not extend into the peripheral regions; the body structure is disposed in the end regions, and may further extend into the peripheral regions in some embodiments; the second sawtooth structure may be disposed in at least one of the end regions and the peripheral regions. The second sawtooth structure may overlap with at least one of the end portions and the connecting parts of the plurality of interdigital electrodes in the third direction.

Referring to FIG. 4A, FIG. 4B and FIG. 5A to FIG. 5D, in some embodiments, the conductive structure 106 includes a body structure BP and a first sawtooth structure SP1, and further includes a second sawtooth structure SP2 which is located at a side of the body structure BP close to the peripheral region GR in the first direction D1; and at least part of the second sawtooth structure SP2 overlaps with a plurality of interdigital electrodes (e.g., a plurality of first interdigital electrodes 11 and/or a plurality of second interdigital electrodes 12) in the third direction D3.

Figure 5A:
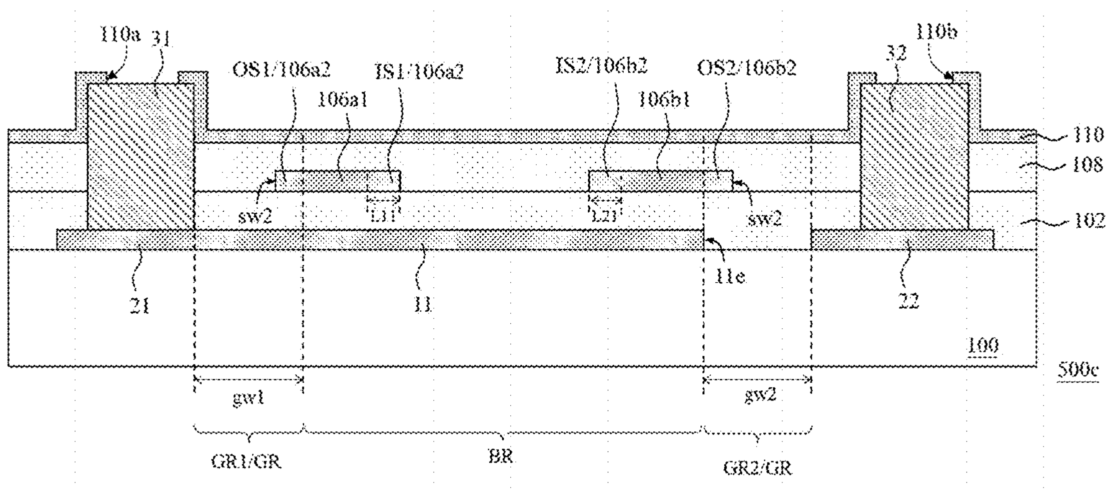
FIG. 5A illustrates a schematic cross-sectional view of a surface acoustic wave resonator device taken along line A-A' of FIG. 4A according to some other embodiments of the present disclosure.
Figure 5B:
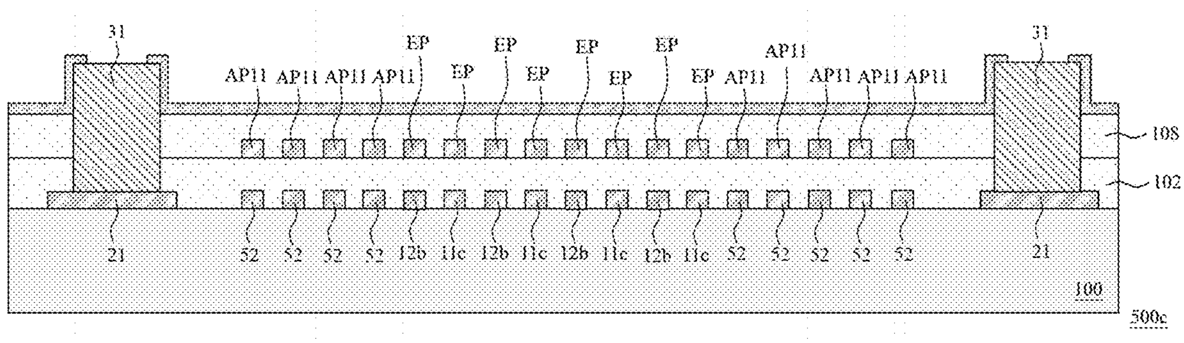
FIG. 5B illustrates a schematic cross-sectional view of a surface acoustic wave resonator device taken along line B-B' of FIG. 4A according to some other embodiments of the present disclosure.
Figure 5C:
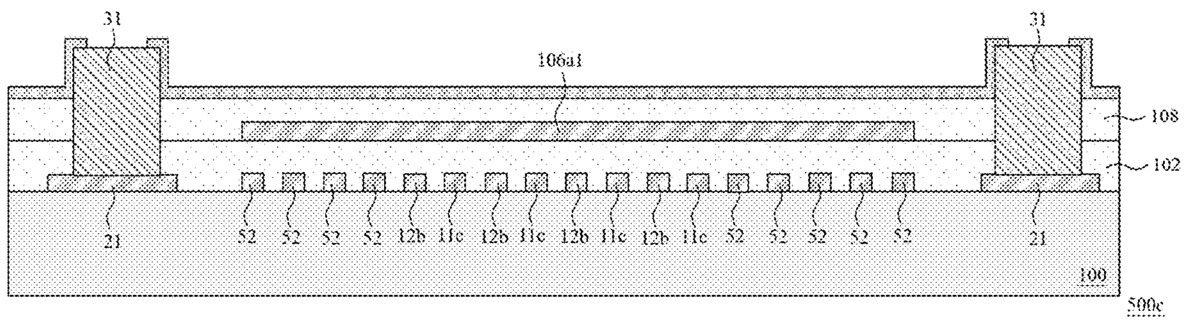
FIG. 5C illustrates a schematic cross-sectional view of a surface acoustic wave resonator device taken along line C-C' of FIG. 4A according to some other embodiments of the present disclosure.
Figure 5D:
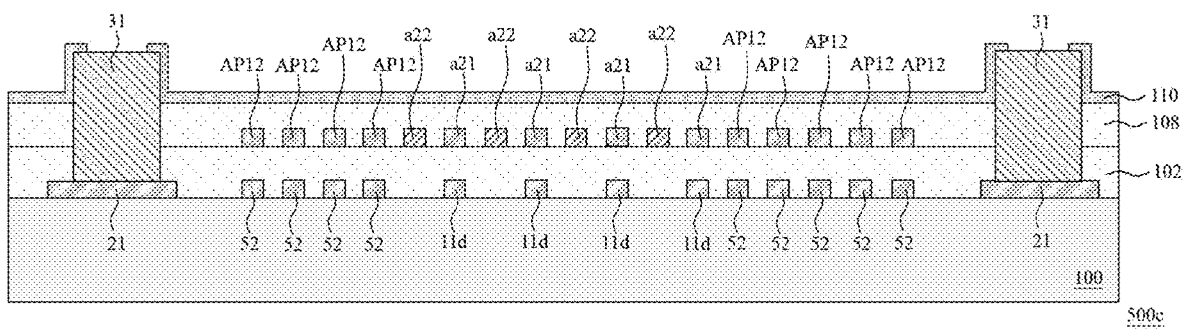
FIG. 5D illustrates a schematic cross-sectional view of a surface acoustic wave resonator device taken along line D-D' of FIG. 4A according to some other embodiments of the present disclosure.

In some embodiments, as shown in FIG. 4A, FIG. 4B and FIG. 5A, the second sawtooth structure SP2 extends beyond at least one of the first electrode edge 11*e* and the second electrode edge 12*e* in the first direction D1, and at least part of the second sawtooth structure SP2 is located in the peripheral regions GR, but the present disclosure is not limited thereto.

In some embodiments, the first conductive layer 106*a* includes a first body part 106*a*1 and a first sawtooth part 106*a*2 connected with each other, and the first sawtooth part 106*a*2 may include a first internal sawtooth IS1 and a first external sawtooth OS1 located at two opposite sides of the first body part 106*a*1 in the first direction D1. For example, the first internal sawtooth IS1 is located at a side of the first body part 106*a*1 away from the first peripheral region GR1, and the first external sawtooth OS1 is located at a side of the first body part 106*a*1 close to the first peripheral region GR1.

In some embodiments, the second conductive layer 106*b* includes a second body part 106*b*1 and a second sawtooth part 106*b*2 connected with each other, and the second sawtooth part 106*b*2 may include a second internal sawtooth IS2 and a second external sawtooth OS2 located at two opposite sides of the second body part 106*b*1 in the first direction D1. For example, the second internal sawtooth IS2 is located at a side of the second body part 106*b*1 away from the second peripheral region GR2, and the second external sawtooth OS2 is located at a side of the second body part 106*b*1 close to the second peripheral region GR2. The first internal sawtooth IS1 and the second internal sawtooth IS2 constitute a first sawtooth structure SP1, which has a structure similar to that described in the previous embodiment with respect to the surface acoustic wave resonator device 500*a*, and the details thereof are not repeated here. The second sawtooth structure SP2 may include at least one of the first external sawtooth OS1 and the second external sawtooth OS2.

In some embodiments, the first external sawtooth OS1 may extend beyond the second electrode edge 12*e* of the second interdigital electrode 12 in the first direction D1, and at least part of the first external sawtooth OS1 is located in the first peripheral region GR1 and overlaps with the connecting part 11*d* of the first interdigital electrode 11 in the third direction D3. The second external sawtooth OS2 may extend beyond the first electrode edge 11*e* of the first interdigital electrode 11 in the first direction, and at least part of the second external sawtooth OS2 is located in the second peripheral region GR2 and overlaps with the connecting part 12*d* of the second interdigital electrode 12.

In some embodiments, the first external sawtooth OS1 and the second external sawtooth OS2 each include a plurality of external extension parts GP, the plurality of external extension parts GP protrude from the second sidewall sw2 of the corresponding body part in the first direction D1 and are arranged at intervals along the second direction D2. Specifically, the plurality of external extension parts GP of the first external sawtooth OS1 may extend in the first direction D1 substantially parallel to each other and protrude from the second sidewall sw2 of the first body part 106*a*1 and towards the first interdigital electrode lead-out part 21. The plurality of external extension parts GP of the second external sawtooth OS2 may extend in the first direction D1 substantially parallel to each other, and protrude from the second sidewall sw2 of the second body part 106*b*1 and towards the second interdigital electrode lead-out part 21.

In some embodiments, one or more internal extension parts of the internal sawtooth in each sawtooth part may be aligned with corresponding external extension part(s) of the external sawtooth in the first direction, and such a sawtooth part may be referred to as an I-shaped sawtooth.

In some embodiments, in each external sawtooth, in the second direction D2, a spacing between adjacent external extension parts among the plurality of external extension parts GP may be equal to or different from a spacing between adjacent interdigital electrodes, for example, the spacing between adjacent external extension parts may be greater than or equal to the spacing between adjacent interdigital electrodes. Each external extension part may be disposed in correspondence with a corresponding interdigital electrode, and a width of each extension part in the second direction may be substantially equal to or different from (for example, smaller than) a width of the corresponding interdigital electrode in the second direction.

In some embodiments, the plurality of external extension parts GP of the first external sawtooth OS1 at least include a first extension sub-part a21; the first extension sub-part a21 overlaps with the first interdigital electrode 11 in the third direction D3. For example, an orthographic projection of the first extension sub-part a21 on the piezoelectric substrate 100 may be located within a range of an orthographic projection of the corresponding first interdigital electrode 11 on the piezoelectric substrate 100.

For example, a plurality of first extension sub-parts a21 may be disposed in one-to-one correspondence with a plurality of first interdigital electrodes 11, and each first extension sub-part a21 overlaps with a corresponding first interdigital electrode 11 (e.g., the connecting part 11*d* and/or the second end part 11*c* thereof) in the third direction D3.

In some embodiments, the plurality of external extension parts GP of the second external sawtooth OS2 at least include a second extension sub-part b21; the second extension sub-part b21 overlaps with the second interdigital electrode 12 in the third direction D3. For example, an orthographic projection of the second extension sub-part b21 on the piezoelectric substrate 100 may be located within a range of an orthographic projection of the corresponding second interdigital electrode 12 on the piezoelectric substrate 100.

For example, a plurality of second extension sub-parts b21 may be disposed in one-to-one correspondence with a plurality of second interdigital electrodes 12, and each second extension sub-part b21 overlaps with a corresponding second interdigital electrode 12 (e.g., the connecting part 12*d* and/or the second end part 12*c* thereof) in the third direction D3.

In some embodiments, the first extension sub-parts a21 extend beyond the end portions of a plurality of interdigital electrodes in the first direction, and overlap with portions of the connecting parts 11*d* of the first interdigital electrodes 11 in the third direction D3; the second extension sub-parts b21 extend beyond the end portions of a plurality of interdigital electrodes in the first direction, and overlap with portions of the connecting parts 12*d* of the second interdigital electrodes 12 in the third direction D3.

In some embodiments, among the first extension sub-part a21 and the first interdigital electrode 11 overlapping with each other, the width of the first extension sub-part a21 in the second direction D2 may be approximately equal to the width of the first interdigital electrode 11 in the second direction D2. The sidewalls of the first extension sub-part a21 opposite to each other in the second direction D2 may be respectively aligned, in the third direction D3, with portions of the sidewalls of the first interdigital electrode 11 opposite to each other in the second direction D2. Among the second extension sub-part b21 and the second interdigital electrode 12 overlapping with each other, the width of the second extension sub-part b21 in the second direction D2 may be approximately equal to the width of the second interdigital electrode 12 in the second direction D2. The sidewalls of the second extension sub-part b21 opposite to each other in the second direction D2 may be respectively aligned, in the third direction D3, with portions of the sidewalls of the second interdigital electrode 12 opposite to each other in the second direction D2. Here, the sidewalls of the extension sub-part or the interdigital electrode opposite to each other in the second direction refer to their respective two sidewalls extending along the first direction D1 and opposite to each other in the second direction D2.

In an alternative embodiment, among the first extension sub-part a21 and the first interdigital electrode 11 overlapping with each other, the width of the first extension sub-part a21 in the second direction D2 may also be smaller than the width of the corresponding first interdigital electrode 11 in the second direction D2. Similarly, among the second extension sub-part b21 and the second interdigital electrode 12 overlapping with each other, the width of the second extension sub-part b21 in the second direction D2 may also be smaller than the width of the second interdigital electrode 12 in the second direction D2.

In some embodiments, among the extension sub-parts and the interdigital electrodes overlapping with each other, the width of the extension sub-part is disposed to be smaller than or equal to the width of the corresponding interdigital electrode, and the orthographic projection of the extension sub-part on the piezoelectric substrate is configured to be located within a range of the orthographic projection of the corresponding interdigital electrode, so as to maximum the overlapping area of the extension sub-part and the interdigital electrode in a case that the extension sub-part has a certain area (for example, a relatively small area), thereby improving the clutter suppression capability thereof to the greatest extent while reducing the metal coverage area of the conductive structure (e.g., a metal structure) to lower the ohmic loss.

In some embodiments, in the first external sawtooth OS1 and/or the second external sawtooth OS2, the plurality of external extension parts may further include an additional extension sub-part. For example, the plurality of external extension parts of the first external sawtooth further include a first additional extension sub-part, and an orthographic projection of the first additional extension sub-part on the piezoelectric substrate is at least partially aligned, in the first direction, with the orthographic projection of the second interdigital electrode on the piezoelectric substrate; the plurality of external extension parts of the second external sawtooth further include a second additional extension sub-part, and an orthographic projection of the second additional extension sub-part on the piezoelectric substrate is at least partially aligned, in the first direction, with the orthographic projection of the first interdigital electrode on the piezoelectric substrate.

Referring to FIG. 4B, for example, at least part of the additional extension sub-part may be located in the peripheral region, and may not overlap with the interdigital electrode in the direction perpendicular to the main surface of the piezoelectric substrate. For example, in the first sawtooth part 106*a*2, the plurality of external extension parts GP of the first external sawtooth OS1 further include one or more first additional extension sub-parts a22, the first additional extension sub-parts a22 is located on a side of the first extension sub-part a21 in the second direction D2 and spaced apart from the first extension sub-part a21. In some embodiments, the first additional extension sub-part a22 may be disposed at a position corresponding to the second interdigital electrode 12 and extend beyond the second electrode edge 12*e* in the first direction D1, and the orthographic projection of the first additional extension sub-part a22 on the piezoelectric substrate may be at least partially aligned with the orthographic projection of the second interdigital electrode 12 on the piezoelectric substrate in the first direction D1, and the orthographic projection of the first additional extension sub-part a22 is located at a side of the orthographic projection of the second interdigital electrode 12 close to the first interdigital electrode lead-out part 21. For example, the orthographic projection of the first additional extension sub-part a22 may border, without overlapping with the orthographic projection of the second electrode edge 12*e* of the second interdigital electrode 12 on the piezoelectric substrate.

In some embodiments, in the first sawtooth part 106*a*2, the plurality of external extension parts GP of the first external sawtooth OS1 include a plurality of first extension sub-parts a21 and a plurality of first additional extension sub-parts a22, the plurality of first extension sub-parts a21 and the plurality of first additional extension sub-parts a22 may be alternately arranged along the second direction D2 and spaced apart from each other.

For example, in the second sawtooth part 106*b*2, the plurality of external extension parts GP of the second external sawtooth OS2 further include one or more second additional extension sub-parts b22, the second additional extension sub-part b22 is located on a side of the second extension sub-part b21 in the second direction D2 and is spaced apart from the second extension sub-part b21. In some embodiments, the second additional extension sub-part b22 may be disposed at a position corresponding to the first interdigital electrode 11 and extend beyond the first electrode edge 11*e* in the first direction D1, and an orthographic projection of the second additional extension sub-part b22 on the piezoelectric substrate may be at least partially aligned, in the first direction D1, with the orthographic projection of the first interdigital electrode 11 on the piezoelectric substrate, and the orthographic projection of the second additional extension sub-part b22 is located at a side of the orthographic projection of the first interdigital electrode 11 close to the second interdigital electrode lead-out part 22. For example, the orthographic projection of the second additional extension sub-part b22 may border but without overlapping the orthographic projection of the first electrode edge 11*e* of the first interdigital electrode 11 on the piezoelectric substrate.

In some embodiments, in the second sawtooth part 106*b*2, the plurality of external extension parts GP of the second external sawtooth OS2 include a plurality of second extension sub-parts b21 and a plurality of second additional extension sub-parts b22, the plurality of second extension sub-parts b21 and the plurality of second additional extension sub-parts b22 may be alternately arranged along the second direction D2 and spaced apart from each other.

Referring to FIG. 4A, FIG. 4B and FIG. 5A to FIG. 5D, in some embodiments, an orthographic projection of the second sidewall of the body structure close to the peripheral region on the piezoelectric substrate may be substantially aligned, in the second direction D2, with an orthographic projection of the corresponding electrode edge on the piezoelectric substrate. For example, the orthographic projection of the second sidewall sw2 of the first body part 106*a*1 on the piezoelectric substrate 100 may be substantially aligned, in the second direction D2, with the orthographic projection of the second electrode edge 12*e* of the second interdigital electrode 12 on the piezoelectric substrate 100. For example, the orthographic projection of the second sidewall sw2 of the second body part 106*b*1 on the piezoelectric substrate 100 may be substantially aligned, in the second direction D2, with the orthographic projection of the first electrode edge 11*e* of the first interdigital electrode 11 on the piezoelectric substrate 100. In other words, a boundary between the body part and the external sawtooth may be substantially aligned with the corresponding electrode edge in the third direction perpendicular to the main surface of the piezoelectric substrate. For example, a boundary between the first body part 106*a*1 and the first external sawtooth OS1 may be substantially aligned with the second electrode edge 12*e* in the third direction D3; a boundary between the second body part 106*b*1 and the second external sawtooth OS2 may be substantially aligned with the first electrode edge 11*e* in the third direction D3. However, the present disclosure is not limited thereto.

In this embodiment, both the body structure BP and the first sawtooth structure SP1 are located in the end regions, and the second sawtooth structure SP2 may be entirely located in the peripheral regions GR. For example, the first external sawtooth OS1 may entirely extend beyond the second electrode edge 12*e* in the first direction D1, and is entirely located in the first peripheral region GR1; an orthographic projection of the first extension sub-part a21 on the piezoelectric substrate is located within a range of an orthographic projection of the connecting part 11*d* of the first interdigital electrode 11 on the piezoelectric substrate, and the entire first additional extension sub-part a22 extends beyond the second electrode edge 12*e* without overlapping with the second interdigital electrode 12 in the third direction. The second external sawtooth OS2 may entirely extend beyond the first electrode edge 11*e* in the first direction D1, and is entirely located in the second peripheral region GR2; wherein an orthographic projection of the second extension sub-part b21 on the piezoelectric substrate 100 is located in an orthographic projection of the connecting part 12*d* of the second interdigital electrode 12 on the piezoelectric substrate, and the entire second additional extension sub-part b22 extends beyond the first electrode edge 11*e* without overlapping with the first interdigital electrode 11 in the third direction.

In some embodiments, as shown in FIG. 4B, in the first direction D1, a distance d1 between the second sidewall sw2 of the first body part 106*a*1 and the first interdigital electrode lead-out part 21 is substantially equal to the first peripheral width gw1; a distance between the second sidewall sw2 of the second body part 106*b*1 and the second interdigital electrode lead-out part 22 may be substantially equal to the second peripheral width gw2.

In this embodiment, a width of the first sawtooth part 106*a*2 in the first direction D1 (that is, a sum of widths of the first internal sawtooth IS1 and the first external sawtooth OS1 in the first direction D1) is smaller than or equal to 20% of the first peripheral width gw1; a width of the second sawtooth part 106*b*2 in the first direction D1 (that is, a sum of widths of the second internal sawtooth IS2 and the second external sawtooth OS2 in the first direction D1) is smaller than or equal to 20% of the second peripheral width gw2. The widths of the first internal sawtooth IS1 and the first external sawtooth OS1 in the first direction D1 may be equal to or different from each other; the widths of the second internal sawtooth IS2 and the second external sawtooth OS2 in the first direction D1 may be equal to or different from each other. The width of the first internal sawtooth IS1 in the first direction D1 is the extension length L11 of the internal extension part EP thereof in the first direction D1, and the width of the first external sawtooth OS1 in the first direction D1 is the extension length L12 of the external extension part GP thereof in the first direction D1. The width of the second internal sawtooth IS2 in the first direction D1 is the extension length L21 of the internal extension part EP thereof in the first direction D1, and the width of the second external sawtooth OS2 in the first direction D1 is the extension length L22 of the external extension part GP thereof in the first direction D1.

It should be understood that, the extension lengths of the plurality of internal extension parts EP may be equal to or different from each other, and the extension lengths of the plurality of external extension parts GP may be equal to or different from each other. For example, in each sawtooth part, the internal extension part and the external extension part that are aligned in the first direction constitute a group of extension parts; and in some embodiments, a sum of extension lengths of the internal extension part and the external extension part in each group of extension parts is within 20% of the corresponding peripheral width.

In some embodiments, a range of the first peripheral width gw1 and a range of the second peripheral width gw2 may each be within 0.1 to 2 times of the wavelength. The width W1 of the first body part 106*a*1 and the width W2 of the second body part 106*b*1 may each be set within 0.25 to 0.5 times of the wavelength. The width of the first sawtooth part 106*a*2 (that is, a sum of widths of the first internal sawtooth and the first external sawtooth) in the first direction and the width of the second sawtooth part 106*b*2 (that is, a sum of widths of the second internal sawtooth and the second external sawtooth) in the first direction may each be set within 0.1 to 0.5 times of the wavelength. For example, in the first direction, the width of the first internal sawtooth and the width of the first external sawtooth may each be set within 0.1 to 0.25 times of the wavelength, and the width of the second internal sawtooth and the width of the second external sawtooth may each be set within 0.1 to 0.25 times of the wavelength. However, the present disclosure is not limited thereto.

In some embodiments, in the conductive structure, thicknesses of the body part, the first sawtooth part and the second sawtooth part in the direction perpendicular to the main surface of the piezoelectric substrate may be substantially equal to or different from each other. For example, a normalized thickness of each body part of the body structure BP, a normalized thickness of each internal sawtooth of the first sawtooth structure SP1 and a normalized thickness of each external sawtooth of the second sawtooth structure SP2 may each range from about 0.03 to 0.12.

Still referring to FIG. 4A, FIG. 4B and FIG. 5A to FIG. 5D, in some embodiments, in each conductive layer of the first conductive layer 106*a* and the second conductive layer 106*b*, the number of the plurality of internal extension parts EP may be equal to the number of the plurality of external extension parts GP; and the number of the internal extension parts EP and the number of the external extension parts GP may be equal to the number of the plurality of interdigital electrodes in the interdigital transducer; wherein each group of extension parts is disposed in correspondence with the corresponding interdigital electrode. In each group of extension parts, a width of the internal extension part in the second direction may be equal to or different from a width of the external extension part in the second direction, and an extension length of the internal extension part in the first direction may be equal to or different from that of the external extension part in the first direction.

In some embodiments, in the first conductive layer or the second conductive layer, in the second direction D2, a spacing between adjacent internal extension parts among the plurality of internal extension parts EP may be equal to or different from a spacing between adjacent external extension parts among the plurality of external extension parts GP; for example, the spacing between adjacent internal extension parts among the plurality of internal extension parts EP may be smaller than or equal to the spacing between adjacent external extension parts among the plurality of external extension parts GP.

In some embodiments, the first internal sawtooth IS1 and the first external sawtooth OS1 may be symmetrically disposed with respect to the first body part 106*a*1; and/or, the second internal sawtooth IS2 and the second external sawtooth OS2 may be symmetrically disposed with respect to the second body part 106*b*1. For example, in the second direction D2, the spacing between adjacent internal extension parts EP and the spacing between adjacent external extension parts GP in the first sawtooth part 106*a*2 and/or the second sawtooth part 106*b*2 may be substantially equal to the spacing between adjacent interdigital electrodes. In each sawtooth part, the width of the internal extension part and the width of the external extension part in each group of extension parts in the second direction may be substantially equal to the width of the corresponding first interdigital electrode or second interdigital electrode in the second direction, and orthographic projections of sidewalls of the internal extension part and the external extension part extending in the first direction on the piezoelectric substrate are aligned, in the first direction, with the orthographic projection of the sidewall of the corresponding interdigital electrode extending in the first direction on the piezoelectric substrate.

Referring to FIG. 4A, similar to the previous embodiment, the first conductive layer 106*a* and the second conductive layer 106*b* may extend to overlap with the reflecting grating, and each include a first additional sawtooth structure AS1 and a second additional sawtooth structure AS2. In this embodiment, the first additional sawtooth structures AS1 are located at two opposite sides of the first body part in the first direction D1, and the second additional sawtooth structures AS2 are located at two opposite sides of the second body part in the first direction D1. For example, the first additional sawtooth structure AS1 includes a first additional internal sawtooth and a first additional external sawtooth. The first additional internal sawtooth may include a plurality of first additional internal extension parts AP11 arranged at intervals in the second direction, and the first additional external sawtooth may include a plurality of first additional external extension parts AP12 arranged at intervals in the second direction. The first additional internal extension part AP11 protrudes from the first sidewall of the first body part in the first direction D1 away from the first peripheral region GR1, and the first additional external extension part AP12 protrudes from the second sidewall of the first body part in the first direction D1 towards the first peripheral region GR1. The second additional sawtooth structure AS2 includes a second additional internal sawtooth and a second additional external sawtooth. The second additional internal sawtooth may include a plurality of second additional internal extension parts AP21 arranged at intervals in the second direction, and the second additional external sawtooth may include a plurality of second additional external extension parts AP22 arranged at intervals in the second direction. The second additional internal extension part AP21 protrudes from the first sidewall of the second body part in the first direction D1 away from the second peripheral region GR2, and the second additional external extension part AP22 protrudes from the second sidewall of the second body part in the first direction D1 towards the second peripheral region GR2.

In some embodiments, in each additional sawtooth structure, the plurality of additional internal extension parts may be aligned with the plurality of additional external extension parts in the first direction, respectively; and orthographic projections of the plurality of additional internal extension parts and the plurality of additional external extension parts on the piezoelectric substrate may be located within a range of an orthographic projection of the reflecting grating (e.g., the plurality of reflective electrodes thereof) on the piezoelectric substrate.

Figure 6A:
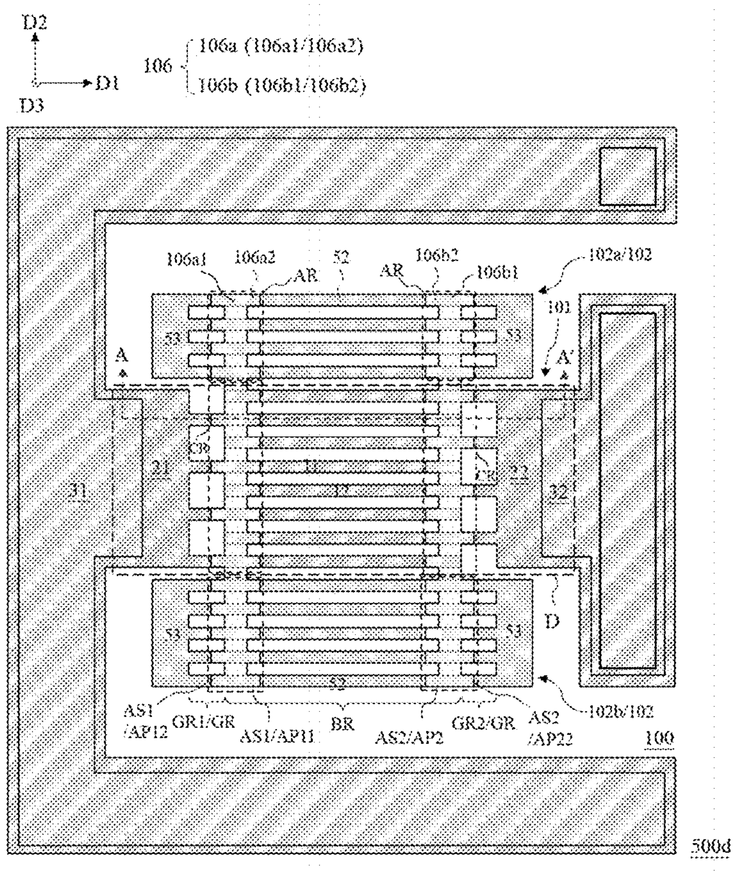
FIG. 6A illustrates a schematic top view of a surface acoustic wave resonator device according to some other alternative embodiments of the present disclosure.
Figure 6B:
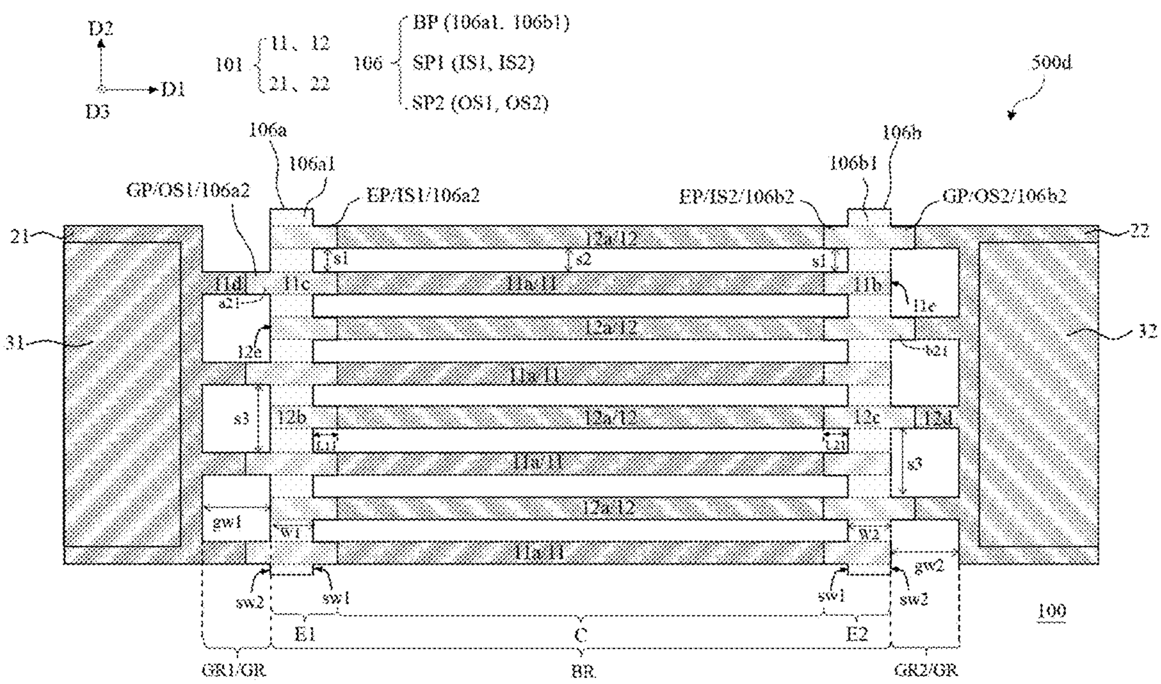
FIG. 6B illustrates a schematic enlarged top view of a partial region of the surface acoustic wave resonator device shown in FIG. 6A according to some other alternative embodiments of the present disclosure.

FIG. 6A illustrates a schematic top view of a surface acoustic wave resonator device 500*d* according to some further embodiments of the present disclosure; FIG. 6B illustrates a schematic enlarged top view of region D of FIG. 6A. The surface acoustic wave resonator device 500*d* is similar to the surface acoustic wave resonator device 500*c*, with the difference that the additional extension sub-parts in the external sawtooth are omitted from the surface acoustic wave resonator device 500*d*.

Referring to FIG. 6A and FIG. 6B, in some embodiments, in the first sawtooth part 106*a*2, the plurality of external extension parts GP of the first external sawtooth OS1 include the first extension sub-part a21, but may not include the first additional extension sub-part a22 shown in FIGS. 4A and 4B. In the second sawtooth part 106*b*2, the plurality of external extension parts GP of the second external sawtooth OS2 include the second extension sub-part b21, but may not include the second additional extension sub-part b22 shown in FIGS. 4A and 4B.

In this embodiment, in each conductive layer, the number of the plurality of internal extension parts in the internal sawtooth is greater than that of the plurality of external extension parts in the external sawtooth; a spacing s3 between two adjacent external extension parts among the plurality of external extension parts GP may be greater than the spacing s1 between adjacent internal extension parts among the plurality of internal extension parts EP, and may be greater than the spacing s2 between adjacent interdigital electrodes. It should be understood that these spacings all refer to spacings in the second direction.

In the first conductive layer 106*a*, the second sidewall sw2 of the first body part 106*a*1 may have a portion aligned with the second electrode edge 12*e* in the third direction D3; the plurality of external extension parts GP of the first external sawtooth OS1 are located in the first peripheral region GR1, and may overlap with a plurality of first interdigital electrodes (for example, the connecting parts thereof) in the third direction, respectively. For example, an orthographic projection of the first external sawtooth OS1 on the piezoelectric substrate may be entirely located within a range of orthographic projections of a plurality of first interdigital electrodes on the piezoelectric substrate. In this example, orthographic projections of the first internal sawtooth IS1 and the first external sawtooth OS1 on the piezoelectric substrate may both be located within a range of orthographic projections of a plurality of interdigital electrodes on the piezoelectric substrate.

In the second conductive layer 106*b*, the second sidewall sw2 of the second body part 106*b*1 may have a portion aligned with the first electrode edge 11*e* in the third direction D3; the plurality of external extension parts GP of the second external sawtooth OS2 are located in the second peripheral region GR2, and may overlap with a plurality of second interdigital electrodes (for example, the connecting parts thereof) in the third direction, respectively. For example, an orthographic projection of the second external sawtooth OS2 on the piezoelectric substrate may be entirely located within a range of orthographic projections of a plurality of second interdigital electrodes on the piezoelectric substrate. In this example, orthographic projections of the second internal sawtooth IS2 and the second external sawtooth OS2 on the piezoelectric substrate may both be located within a range of orthographic projections of a plurality of interdigital electrodes on the piezoelectric substrate.

In the embodiments shown in FIG. 4A to FIG. 6B, a boundary between the body part and the external sawtooth is aligned with the corresponding electrode edge; both the body part and the internal sawtooth are located in the end region and overlap with end portions of a plurality of interdigital electrodes; the external sawtooth is entirely located in the peripheral region, and overlaps with connecting parts of a plurality of interdigital electrodes. However, the present disclosure is not limited thereto. In alternative embodiments, the boundary between the body part and the external sawtooth (or the second sidewall of the body part) may also be offset in the first direction with respect to the corresponding electrode edge, so that the body part may be located in both the end region and the peripheral region, or the external sawtooth may be located in both the end region and the peripheral region. Some examples of the alternative embodiments are described below with reference to the drawings.

In some examples, the second sawtooth structure further includes at least one of the following features: the first external sawtooth may further include a portion overlapping with the second interdigital electrode in the third direction; the second external sawtooth may further include a portion overlapping with the first interdigital electrode in the third direction.

Figure 7A:
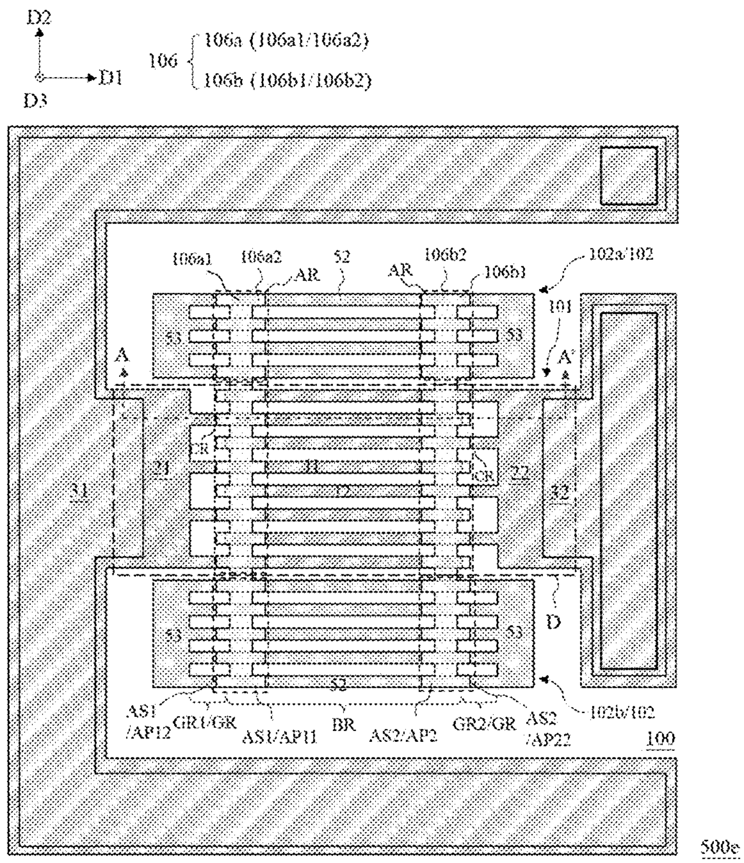
FIG. 7A illustrates a schematic top view of a surface acoustic wave resonator device according to still other embodiments of the present disclosure.
Figure 7B:
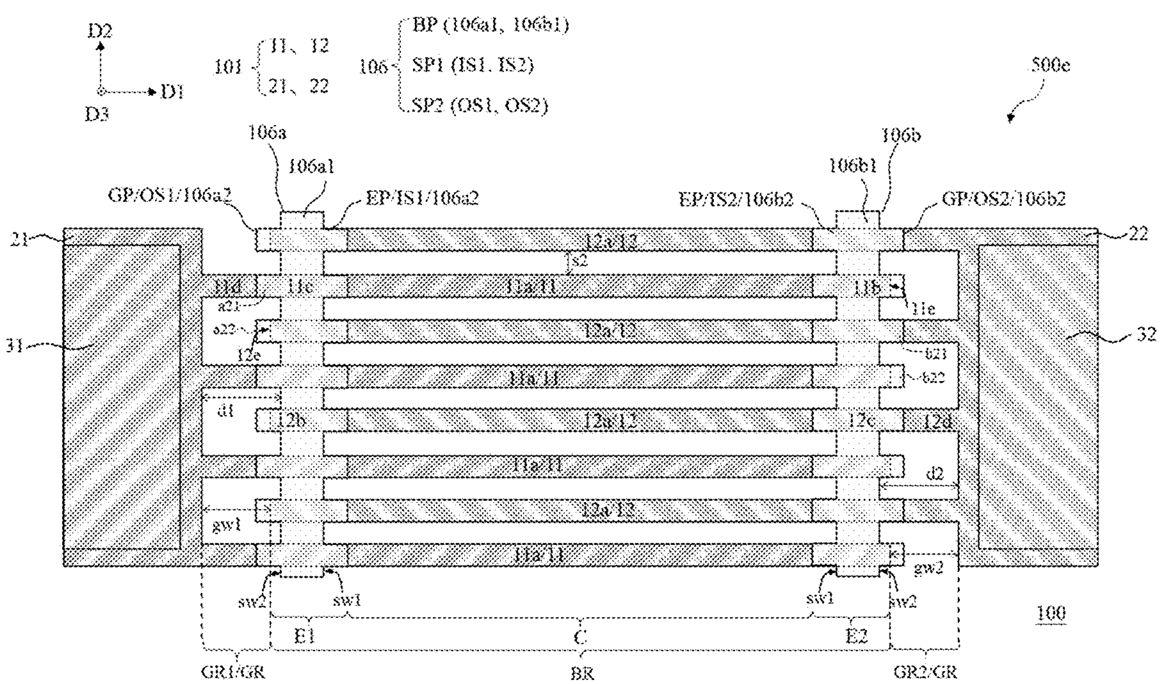
FIG. 7B illustrates a schematic enlarged top view of a partial region of the surface acoustic wave resonator device shown in FIG. 7A according to still other embodiments of the present disclosure.

FIG. 7A illustrates a schematic top view of a surface acoustic wave resonator device 500*e* according to some further embodiments of the present disclosure; FIG. 7B illustrates a schematic enlarged top view of a region D of FIG. 7A. The surface acoustic wave resonator device 500*e* is structurally similar to the surface acoustic wave resonator device 500*c*, with the difference that, in the surface acoustic wave resonator device 500*e*, the second sidewall of the body structure is offset in the first direction away from the corresponding peripheral region(s) with respect to the first electrode edge and/or the second electrode edge.

Referring to FIG. 7A and FIG. 7B, in some embodiments, in the first conductive layer 106*a*, a boundary between the first body part 106*a*1 and the first external sawtooth OS1 (or the second sidewall sw2 of the first body part 106*a*1) may be offset in the first direction D1 away from the first peripheral region GR1 with respect to the second electrode edge 12*e*; that is, in the first direction D1, a distance d1 between the second sidewall sw2 of the first body part 106*a*1 and the first interdigital electrode lead-out part 21 is greater than a distance (i.e., the first peripheral width gw1) between the second electrode edge 12*e* and the first interdigital electrode lead-out part 21. In the second conductive layer 106*b*, a boundary between the second body part 106*b*1 and the second external sawtooth OS2 (or the second sidewall sw2 of the second body part 106*b*1) may be offset in the first direction D1 away from the second peripheral region GR2 with respect to the first electrode edge 11*e*; that is, in the first direction D1, a distance d2 between the second sidewall sw2 of the second body part 106*b*1 and the second interdigital electrode lead-out part 22 is greater than a distance (i.e., the second peripheral width gw2) between the first electrode edge 11*e* and the second interdigital electrode lead-out part 22.

In this embodiment, in the third direction D3, the end portions of the plurality of interdigital electrodes not only overlap with the body structure BP and the first sawtooth structure SP1 of the conductive structure, but also partially overlap with the second sawtooth structure SP2. For example, in the third direction D3, the second end part 11*c* of the first interdigital electrode 11 and the first end part 12*b* of the second interdigital electrode 12 overlap with the first body part 106*a*1 and the first internal sawtooth IS1, and also overlap with the first external sawtooth OS1; the first end part 11*b* of the first interdigital electrode 11 and the second end part 12*c* of the second interdigital electrode 12 overlap with the second body part 106*b*1 and the second internal sawtooth IS2, and also overlap with the second external sawtooth OS2.

The first external sawtooth OS1 and the second external sawtooth OS2 each extend from the end region into the peripheral region; that is, each external sawtooth has a portion located in the end region, and another portion extending beyond the corresponding electrode edge in the first direction and located in the peripheral region. In this example, an orthographic projection of the first additional extension sub-part of the first external sawtooth on the piezoelectric substrate may partially overlap with an orthographic projection of the second interdigital electrode on the piezoelectric substrate, and an orthographic projection of the second additional extension sub-part of the second external sawtooth on the piezoelectric substrate may partially overlap with an orthographic projection of the first interdigital electrode on the piezoelectric substrate.

Among the plurality of external extension parts GP of the first external sawtooth OS1, a portion of the first extension sub-part a21 overlaps with the second end part 11*c* of the first interdigital electrode 11 in the third direction, and another portion of the first extension sub-part a21 overlaps with the connecting part 11*d* of the first interdigital electrode in the third direction; a portion of the first additional extension sub-part a22 overlaps with the first end part 12*b* of the second interdigital electrode 12 in the third direction, and another portion of the first additional extension sub-part a22 extends beyond the second electrode edge 12*e* and does not overlap with the interdigital electrode in the third direction.

Among the plurality of external extension parts GP of the second external sawtooth OS2, a portion of the second extension sub-part b21 overlaps with the second end part 12*c* of the second interdigital electrode 12 in the third direction, and another portion of the second extension sub-part b21 overlaps with the connecting part 12*d* of the second interdigital electrode 12 in the third direction; a portion of the second additional extension sub-part b22 overlaps with the first end part 11*b* of the first interdigital electrode 11 in the third direction, and another portion of the second additional extension sub-part b22 extends beyond the first electrode edge 11*e* in the first direction, without overlapping with the interdigital electrode in the third direction. Among the plurality of external extension parts, an extension length of the extension sub-part in the first direction is equal to or different from an extension length of the additional extension sub-part in the first direction. For example, the extension length of the extension sub-part may be greater than or equal to the extension length of the additional extension sub-part.

In some alternative embodiments, portions of the first and second additional extension sub-parts a22 and b22 shown in FIGS. 7A and 7B that extend beyond the corresponding electrode edges may be removed, so that orthographic projections of the additional extension sub-parts on the piezoelectric substrate are also located within a range of the orthographic projections of the corresponding interdigital electrodes on the piezoelectric substrate. In this example, in each sawtooth part, a width of the extension sub-part in the first direction may be greater than a width of the additional extension sub-part in the first direction.

Figure 8A:
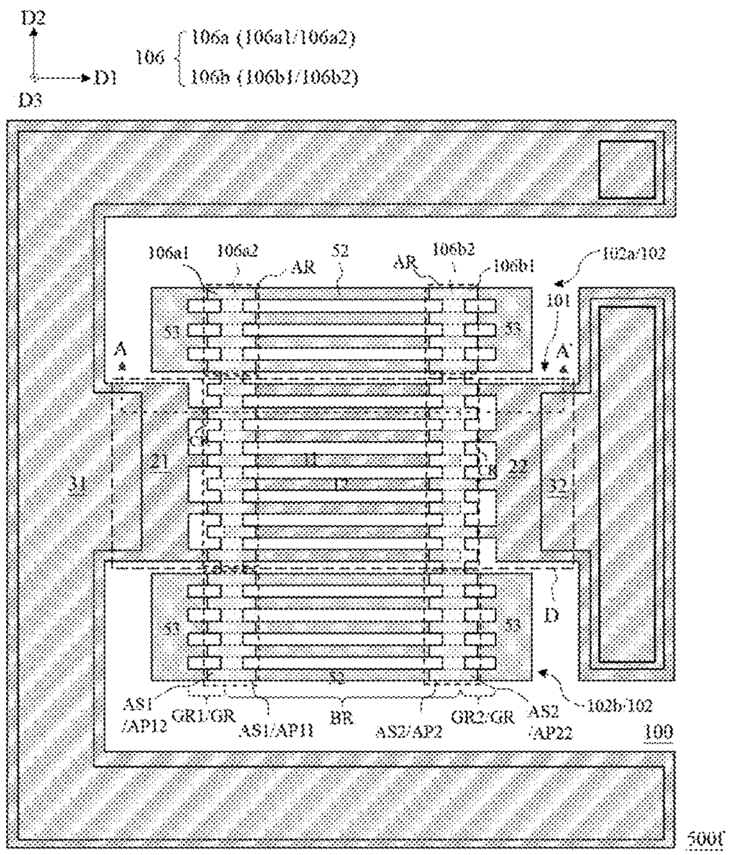
FIG. 8A illustrates a schematic top view of a surface acoustic wave resonator device according to some further embodiments of the present disclosure.
Figure 8B:
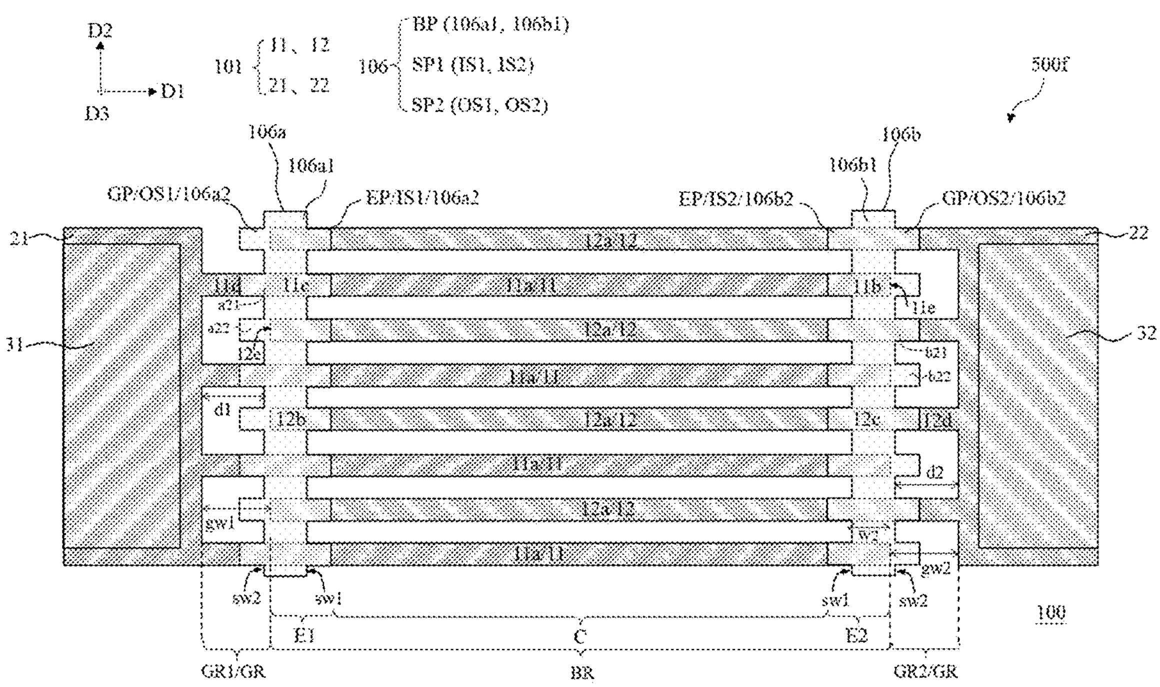
FIG. 8B illustrates a schematic enlarged top view of a partial region of the surface acoustic wave resonator device shown in FIG. 8A according to some further embodiments of the present disclosure.

FIG. 8A illustrates a schematic top view of a surface acoustic wave resonator device 500*f* according to still other embodiments of the present disclosure, and FIG. 8B illustrates a schematic enlarged top view of a region D of FIG. 8A. The surface acoustic wave resonator device 500*f* is structurally similar to the surface acoustic wave resonator device 500*c*, with the difference that, in the surface acoustic wave resonator device 500*f*, the second sidewall of the body structure is offset in the first direction towards the corresponding peripheral region with respect to the first electrode edge and/or the second electrode edge.

Referring to FIG. 8A and FIG. 8B, in some embodiments, in the first conductive layer 106*a*, a boundary between the first body part 106*a*1 and the first external sawtooth OS1 (or the second sidewall sw2 of the first body part 106*a*1) may be offset in the first direction D1 towards the first peripheral region GR1 and the first interdigital electrode lead-out part, with respect to the second electrode edge 12*e*; that is, in the first direction D1, a distance d1 between the second sidewall sw2 of the first body part 106*a*1 and the first interdigital electrode lead-out part 21 is smaller than a distance (i.e., the first peripheral width gw1) between the second electrode edge 12*e* and the first interdigital electrode lead-out part 21. In the second conductive layer 106*b*, a boundary between the second body part 106*b*1 and the second external sawtooth OS2 (or the second sidewall sw2 of the second body part 106*b*1) may be offset in the first direction D1 towards the second peripheral region GR2 and the second interdigital electrode lead-out part with respect to the first electrode edge 11*e*; that is, in the first direction D1, a distance d2 between the second sidewall sw2 of the second body part 106*b*1 and the second interdigital electrode lead-out part 22 is smaller than a distance (i.e., the second peripheral width gw2) between the first electrode edge 11*e* and the second interdigital electrode lead-out part 22.

In this embodiment, the body part of each conductive layer extends beyond the corresponding electrode edge in the first direction, and overlaps with end portions of a plurality of interdigital electrodes and a portion of connecting parts of the corresponding interdigital electrodes in the third direction; and each external sawtooth is located in the peripheral region. In the third direction, the end portions of the plurality of interdigital electrodes overlap with the body structure and the first sawtooth structure of the conductive structure; and the connecting parts of the plurality of interdigital electrodes can overlap with the body structure and the second sawtooth structure of the conductive structure.

For example, the first body part 106*a*1 extends beyond the second electrode edge 12*e* in the first direction D1, and the end portions of the plurality of interdigital electrodes located in the first end region E1 overlap with a portion of the first body part 106*a*1 and the first internal sawtooth IS1 in the third direction; portions of connecting parts 11*d* of a plurality of first interdigital electrodes 11 overlap with the first external sawtooth OS1 and overlap with a portion of the first body part 106*a*1 in the third direction D3.

For example, the second body part 106*b*1 extends beyond the first electrode edge 11*e* in the first direction D1, and the end portions of the plurality of interdigital electrodes located in the second end region E2 overlap with a portion of the second body part 106*b*1 and the second internal sawtooth IS2 in the third direction; portions of connecting parts 12*d* of a plurality of second interdigital electrodes 12 overlap with the second external sawtooth OS2 and overlap with a portion of the second body part 106*b*1 in the third direction D3. In this example, an orthographic projection of the first additional extension sub-part a22 on the piezoelectric substrate is offset from an orthographic projection of the second interdigital electrode 12 on the piezoelectric substrate, and an orthographic projection of the second additional extension sub-part b22 on the piezoelectric substrate is offset from an orthographic projection of the first interdigital electrode 11 on the piezoelectric substrate. In an alternative embodiment, the additional extension sub-parts (i.e., the first additional extension sub-parts a22 and the second additional extension sub-parts b22) of the respective sawtooth parts in this example may also be removed.

Figure 9A:
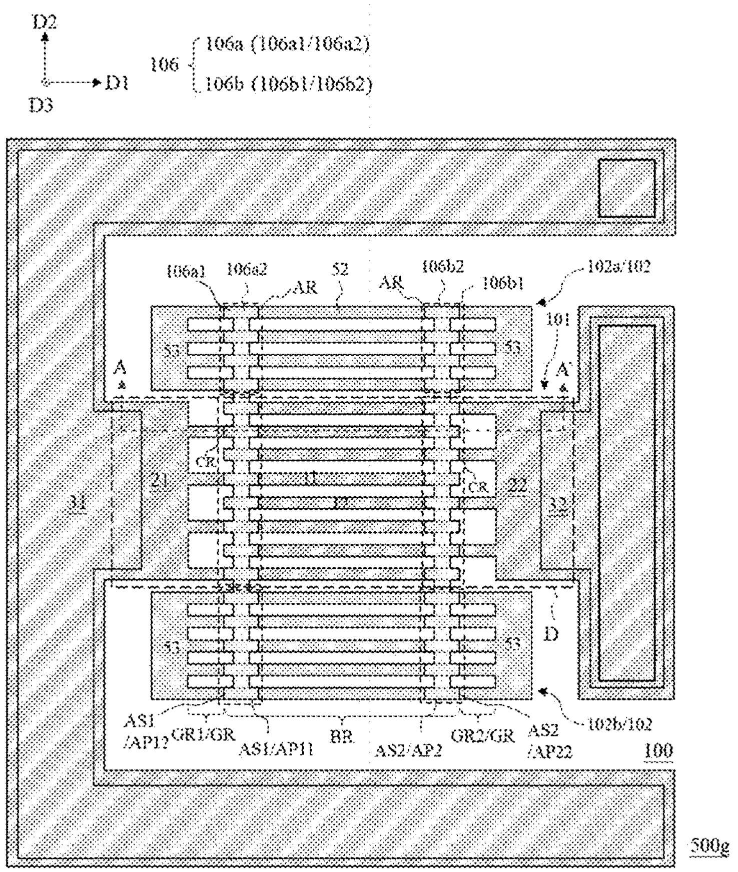
FIG. 9A illustrates a schematic top view of a surface acoustic wave resonator device according to still further embodiments of the present disclosure.
Figure 9B:
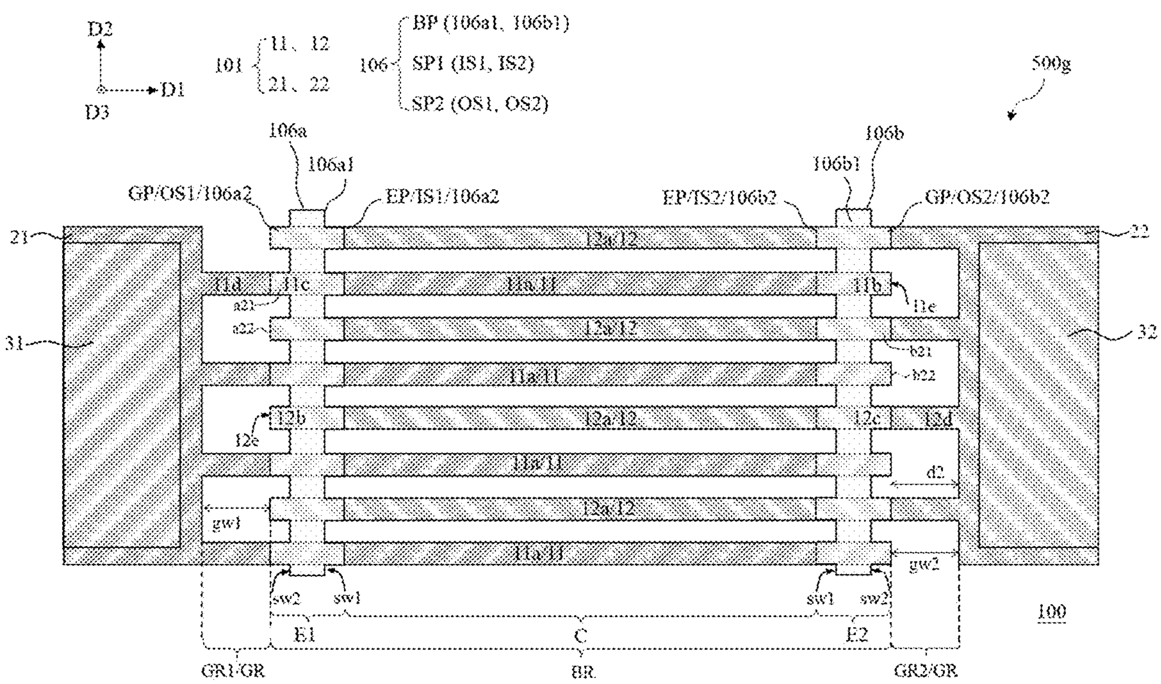
FIG. 9B illustrates a schematic enlarged top view of a partial region of the surface acoustic wave resonator device shown in FIG. 9A according to still further embodiments of the present disclosure.

FIG. 9A illustrates a schematic top view of a surface acoustic wave resonator device 500*g* according to some further embodiments of the present disclosure, and FIG. 9B illustrates a schematic enlarged top view of a region D of FIG. 9A. The surface acoustic wave resonator device 500*g* is structurally similar to the surface acoustic wave resonator device 500*c*, with the difference that in the surface acoustic wave resonator device 500*g*, the body structure, the first sawtooth structure and the second sawtooth structure of the conductive structure are all located in the end regions and do not extend into the peripheral regions.

Referring to FIG. 9A and FIG. 9B, in some embodiments, the body structure BP, the first sawtooth structure SP1 and the second sawtooth structure SP2 of the conductive structure 106 may all be located in the end regions without extending into the peripheral regions. The second sawtooth structure SP2 may have a sidewall aligned with the first electrode edge 11*e* and/or the second electrode edge 12*e* in the third direction D3. End portions of the first interdigital electrode and the second interdigital electrode overlap with the body structure, the first sawtooth structure and the second sawtooth structure of the conductive structure in the third direction D3. Each internal extension part of the first sawtooth structure and each external extension part of the second sawtooth structure may both overlap with the corresponding interdigital electrodes in the third direction, and an orthographic projection of each extension part on the piezoelectric substrate may be located within a range of an orthographic projection of the corresponding interdigital electrode on the piezoelectric substrate.

For example, in the first conductive layer 106, the first body part 106*a*1, the first internal sawtooth IS1 and the first external sawtooth OS1 are all located in the first end region E1; and the second end part 11*c* of each first interdigital electrode 11 and the first end part 12*b* of each second interdigital electrode 12 may each have a portion overlapping with the first body part 106*a*1, a portion overlapping with the first internal sawtooth IS1 and a portion overlapping with the first external sawtooth OS1, in the third direction. The first external sawtooth OS1 may have a sidewall (e.g., a sidewall of the first additional extension sub-part a22)

aligned with the second electrode edge 12*e* in the third direction D3. In this example, the orthographic projection of the first extension sub-part a21 on the piezoelectric substrate is located within a range of the orthographic projection of the first interdigital electrode 11 on the piezoelectric substrate, and the orthographic projection of the first additional extension sub-part a22 on the piezoelectric substrate is located within a range of the orthographic projection of the second interdigital electrode 12 on the piezoelectric substrate.

For example, in the second conductive layer, the second body part 106*b*1, the second internal sawtooth IS2 and the second external sawtooth OS2 are all located in the second end region E2; and the first end part 11*b* of each first interdigital electrode 11 and the second end part 12*c* of each second interdigital electrode 12 may each have a portion overlapping with the second body part 106*b*1, a portion overlapping with the second internal sawtooth IS2 and a portion overlapping with the second external sawtooth OS2, in the third direction D3. The second external sawtooth OS2 may have a sidewall (for example, a sidewall of the second additional extension sub-part b22) aligned with the first electrode edge 11*e* in the third direction D3. In this example, the orthographic projection of the second extension sub-part b21 on the piezoelectric substrate is located within a range of the orthographic projection of the second interdigital electrode 12 on the piezoelectric substrate, and the orthographic projection of the second additional extension sub-part b22 on the piezoelectric substrate is located within a range of the orthographic projection of the first interdigital electrode 11 on the piezoelectric substrate. In this embodiment, the connecting part 11*d* of the first interdigital electrode 11 and the connecting part 12*d* of the second interdigital electrode 12 do not overlap with the conductive structure in the third direction D3; that is, orthographic projections of the connecting part 11*d* of the first interdigital electrode 11 and the connecting part 12*d* of the second interdigital electrode 12 on the piezoelectric substrate 100 are offset from the orthographic projection of the conductive structure 106 on the piezoelectric substrate 100.

The embodiments shown in FIGS. 7A to 9B illustrate various examples in which the conductive structure is offset in the first direction based on the surface acoustic wave resonator device 500*c*. It should be understood that similar changes can also be made based on the surface acoustic wave resonator device 500*d* so that the conductive structure thereof is offset in the first direction, thereby obtaining other alternative embodiments. In addition, in alternative embodiments such as FIGS. 7A to 9B, after the conductive structure is offset in the first direction, widths, in the first direction D1, of the body part, the internal sawtooth and the external sawtooth in each conductive layer can be appropriately adjusted according to the product designs and needs, so as to satisfy the product requirements and ensure the clutter suppression capability of the conductive structure.

The embodiment of the present disclosure further provides a filter, which includes any one of the above-described surface acoustic wave resonator devices, and the filter has the same technical effects described above with respect to the surface acoustic wave resonator devices.

Referring to FIG. 1A to FIG. 9B, the embodiments of the present disclosure provide a manufacturing method for a surface acoustic wave resonator device. In some embodiments, the manufacturing method includes: providing a piezoelectric substrate 100, forming an interdigital transducer on a side of the piezoelectric substrate 100, and forming a conductive structure on a side of the interdigital transducer away from the piezoelectric substrate.

The piezoelectric substrate 100 may include a suitable piezoelectric material such as piezoelectric crystal, piezoelectric ceramic or the like. For example, the material of the piezoelectric substrate 100 may include aluminum nitride (AlN), doped aluminum nitride, zinc oxide (ZnO), lead zirconate titanate (PZT), lithium niobate ($LiNbO_3$), quartz, potassium niobate ($KNbO_3$), lithium tantalate ($LiTaO_3$), the like or combinations thereof. In some embodiments, the piezoelectric substrate 100 may be a single-layered structure or a multi-layered structure, for example, may be a composite structure of piezoelectric thin films, such as a composite structure of a lithium tantalate piezoelectric thin film/silicon dioxide/a silicon substrate. In some embodiments, the piezoelectric substrate 100 may be a monocrystal piezoelectric substrate. However, the present disclosure is not limited thereto.

In some embodiments, the interdigital transducer may include a metal material, for example, may include one or more metal materials such as Ti, Cr, Ag, Cu, Mo, Pt, W, Al, etc. The interdigital transducer may be formed by a deposition process such as evaporation and a patterning process. For example, forming the interdigital transducer includes: depositing and forming an electrode material layer on the piezoelectric substrate, and performing a patterning process on the electrode material layer. The electrode material layer may be a single-layered structure or a multi-layered structure, for example, may be a combined lamination of two or more of the above metal materials. In some embodiments, a reflecting grating 102 is formed on the piezoelectric substrate 100; and the reflecting grating 102 and the interdigital transducer 101 may be formed from the electrode material layer by the same one patterning process. For specific structures of the interdigital transducer 101 and the reflecting grating 102, reference can be made to the above description without repeating here.

In some embodiments, the manufacturing method further includes: forming a dielectric layer 102 on the piezoelectric substrate 100 to cover the sidewalls of the interdigital transducer 101 and the reflecting grating 102 and the surfaces of the interdigital transducer 101 and the reflecting grating 102 at a side away from the piezoelectric substrate 100, before forming the clutter suppression structure 106. The dielectric layer 102 may include a dielectric material such as silicon oxide, and may be used as a temperature compensation layer. In some embodiments, the manufacturing method may further include: forming a protection layer (not shown) on the piezoelectric substrate 100 before forming the dielectric layer 102. The protection layer extends along the surfaces of the interdigital transducer and the reflecting grating; and the interdigital transducer and the reflecting grating are spaced apart from the subsequently formed dielectric layer 102 by the protection layer. The protection layer can protect the interdigital transducer and the reflecting grating from being oxidized, for example, during the process of forming the dielectric layer 102.

In some embodiments, after the dielectric layer 102 is formed, a conductive structure 106 is formed on a side of the dielectric layer 102 away from the piezoelectric substrate 100 and used as a clutter suppression structure. The conductive structure 106 may include a metal structure, and may include a metal material such as gold, tungsten, silver, titanium, platinum, aluminum, copper, molybdenum, the like, alloys thereof or combinations thereof. The metal structure may be formed by forming a metal material layer on a side of the dielectric layer 102 away from the piezoelectric substrate 100 through a deposition process such as evaporation, and patterning the metal material layer.

In the embodiments of the present disclosure, each conductive layer of the conductive structure includes a body part and a sawtooth part, and the body part and the sawtooth part are connected with each other and integrally formed; wherein the body part is disposed to continuously extend across a plurality of interdigital electrodes in the second direction, and the sawtooth part includes a plurality of extensions arranged at intervals. In this way, on the one hand, the body part extending continuously and connected with the sawtooth part allows to improve the stability of the conductive structure formed in the manufacturing process; and on the other hand, the sawtooth part allows to improve the clutter suppression capability of the conductive structure while relatively decreasing the overall metal coverage area of the conductive structure, thereby reducing the ohmic loss and improving the device performance.

In some embodiments, the manufacturing method further includes: forming a dielectric layer 108 on a side of the dielectric layer 102 away from the piezoelectric substrate after forming the clutter suppression structure 106; forming a first conductive connector 31 and a second conductive connector 32 to be respectively connected to the first interdigital electrode lead-out part and the second interdigital electrode lead-out part; and forming a passivation layer 110 and removing a part of the passivation layer 110 to form a first passivation opening and a second passivation opening.

Figure 10A:
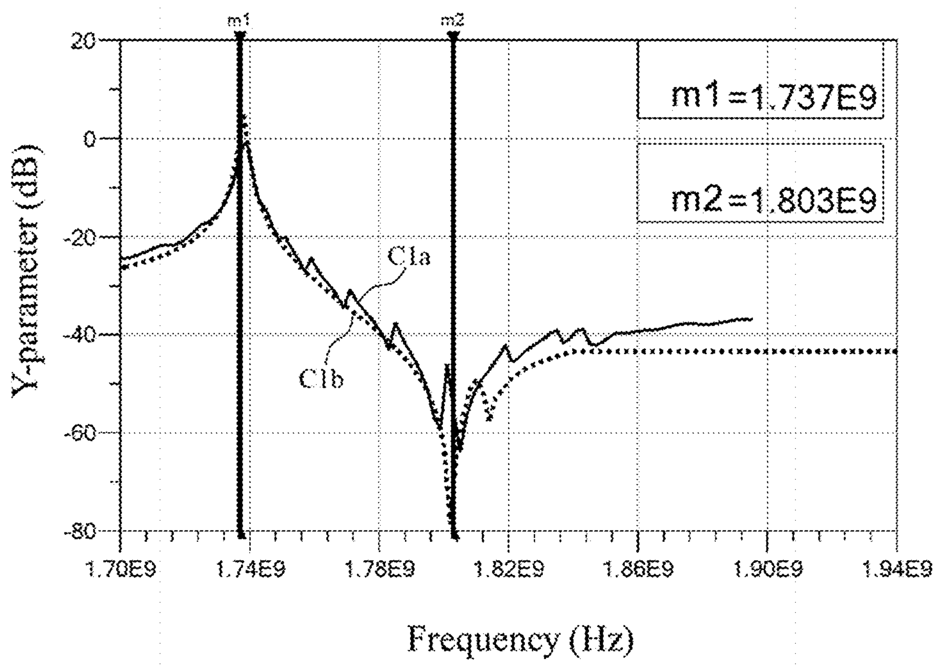
FIG. 10A illustrates admittance response diagrams of a conventional surface acoustic wave resonator device and a surface acoustic wave resonator device according to some embodiments of the present disclosure.
Figure 10B:
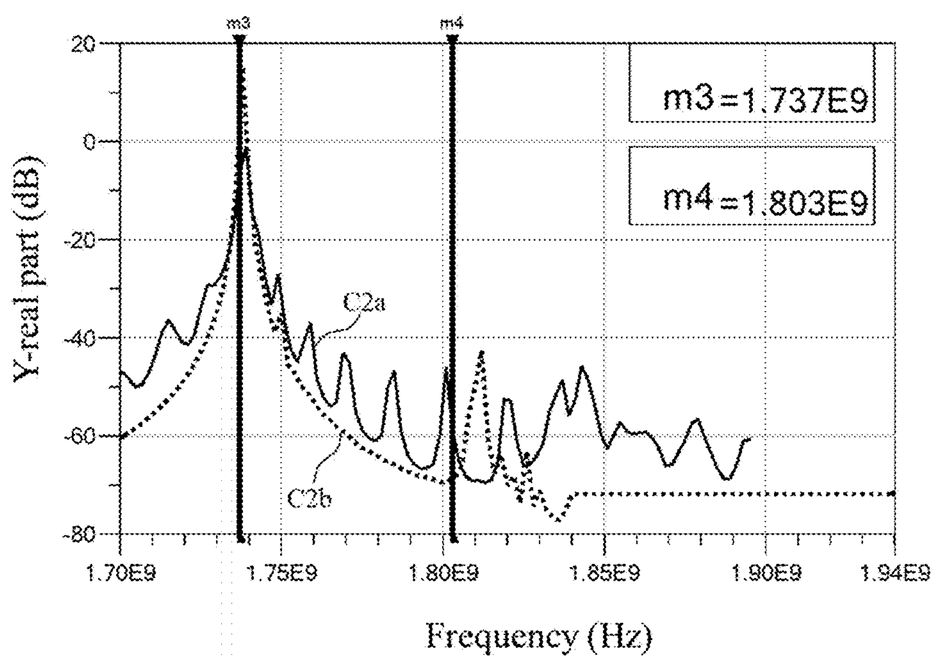
FIG. 10B illustrates real-part response diagrams of a conventional surface acoustic wave resonator device and a surface acoustic wave resonator device according to some embodiments of the present disclosure.

FIG. 10A illustrates admittance response diagrams of a conventional surface acoustic wave resonator device and a surface acoustic wave resonator device 500*a* according to an embodiment of the present disclosure, in which an admittance vs frequency response curve C1*a* (shown by a solid line) of the conventional surface acoustic wave resonator device and an admittance vs frequency response curve C1*b* (shown by a dotted line) of the surface acoustic wave resonator device 500*a* according to an embodiment of the present disclosure are shown. FIG. 10B illustrates real part response diagrams of a conventional surface acoustic wave resonator device and a surface acoustic wave resonator device 500*a* according to an embodiment of the present disclosure, in which a real part vs frequency response curve C2*a* (shown by a solid line) of the conventional surface acoustic wave resonator device and a real part vs frequency response curve C2*b* (shown by a dotted line) of the surface acoustic wave resonator device 500*a* according to an embodiment of the present disclosure are shown.

Referring to FIG. 10A and FIG. 10B, it should be understood that, more spurious peaks in the frequency response curve indicates more clutters in the resonator, and a smoother frequency response curve indicates less clutter in the resonator. Comparing the admittance vs frequency response curve C1*a* and the real part vs frequency response curve C2*a* of the traditional surface acoustic wave resonator device, with the admittance vs frequency response curve C1*b* and the real part vs frequency response curve C2*b* of the surface acoustic wave resonator device 500*a* of the embodiment of the present disclosure, it can be seen that: in a specific frequency range, for example, in some examples, in the frequency range of 1.737E9 to 1.803E9 Hz, both the admittance vs frequency response curve C1*a* and the real part vs frequency response curve C2*a* of the traditional resonator have multiple spurious peaks, that is, there are multiple clutters in spurious modes; while the admittance vs frequency response curve Clb and the real part vs frequency response curve C2*b* of the surface acoustic wave resonator structure 500*a* are both smooth and have no obvious spurious peaks, this is because the formation and/or propagation of clutter is suppressed by disposing the conductive structure 106 including the body structure and the first sawtooth structure, and the clutter suppression capability of the conductive structure 106 is improved by the above-mentioned structural configurations. In this way, the energy loss is avoided or reduced, and the performance of the resonator is improved.

Figure 11A:
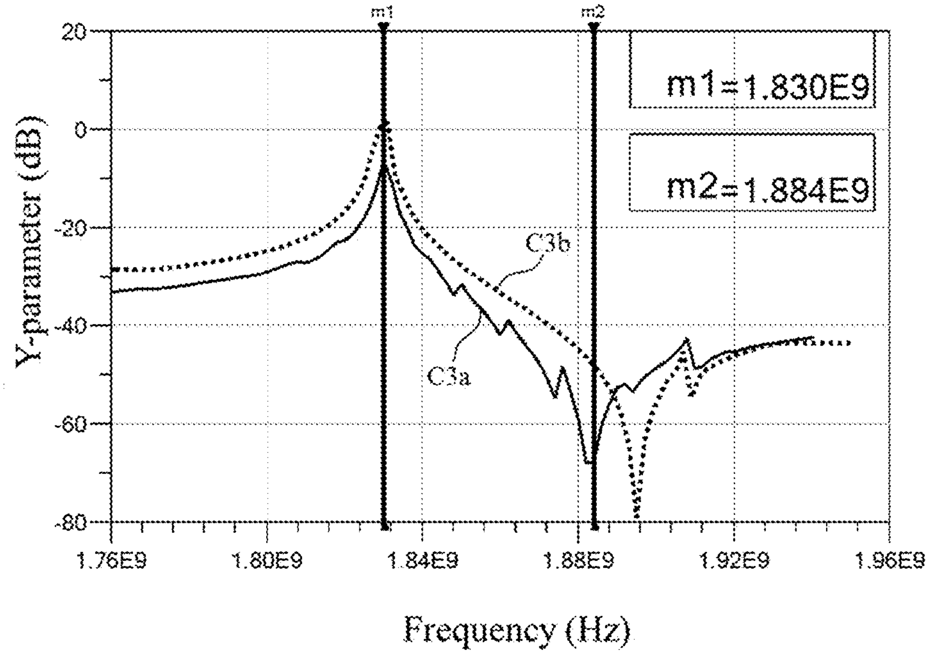
FIG. 11A illustrates admittance response diagrams of a conventional surface acoustic wave resonator device and a surface acoustic wave resonator device according to some other embodiments of the present disclosure.
Figure 11B:
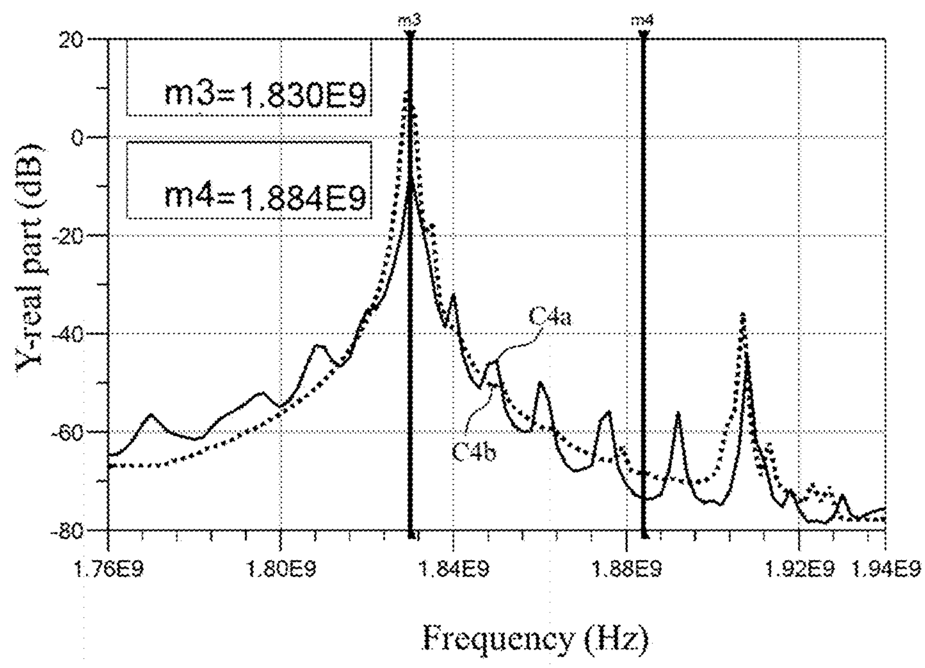
FIG. 11B illustrates real-part response diagrams of a conventional surface acoustic wave resonator device and a surface acoustic wave resonator device according to some other embodiments of the present disclosure.

FIG. 11A illustrates admittance response diagrams of a conventional surface acoustic wave resonator device and a surface acoustic wave resonator device 500*c* according to an embodiment of the present disclosure, in which an admittance vs frequency response curve C3*a* (shown by a solid line) of the conventional surface acoustic wave resonator device and an admittance vs frequency response curve C3*b* (shown by a dotted line) of the surface acoustic wave resonator device 500*a* according to an embodiment of the present disclosure are shown. FIG. 11B illustrates real part response diagrams of a conventional surface acoustic wave resonator device and a surface acoustic wave resonator device 500*c* according to an embodiment of the present disclosure, in which a real part vs frequency response curve C4*a* (shown by a solid line) of the conventional surface acoustic wave resonator device and a real part vs frequency response curve C4*b* (shown by a dotted line) of the surface acoustic wave resonator device 500*c* according to an embodiment of the present disclosure are shown.

Referring to FIG. 11A and FIG. 11B, it should be understood that, comparing the admittance vs frequency response curve C3*a* and the real part vs frequency response curve C4*a* of the traditional surface acoustic wave resonator device, with the admittance vs frequency response curve C3*b* and the real part vs frequency response curve C4*b* of the surface acoustic wave resonator device 500*c* of the embodiment of the present disclosure, it can be seen that: in a specific frequency range, for example, in some examples, in the frequency range of 1.830E9 to 1.884E9 Hz, both the admittance vs frequency response curve C3*a* and the real part vs frequency response curve C4*a* of the traditional resonator have multiple spurious peaks, that is, there are multiple clutters in spurious modes; while the admittance vs frequency response curve C3*b* and the real part vs frequency response curve C4*b* of the surface acoustic wave resonator structure 500*c* are both smooth and have no obvious spurious peaks, this is because the formation and/or propagation of clutter is suppressed by disposing the conductive structure 106 including the body structure, the first sawtooth structure and the second sawtooth structure, and the clutter suppression capability of the conductive structure 106 is improved by the above-mentioned structural configurations. In this way, the energy loss is avoided or reduced, and the performance of the resonator is improved.

It should be understood that in various embodiments, the positions and/or related dimensions of the body structure, the first sawtooth structure and/or the second sawtooth structure can be adjusted, so that the conductive structure can perform clutter suppression for resonator devices with required frequency and the clutter suppression capability can be improved.

The following statements should be noted: (1) the accompanying drawings related to the embodiment(s) of the present disclosure involve only the structure(s) in connection with the embodiment(s) of the present disclosure, and other structure(s) can be referred to common design(s); (2) in case of no conflict, features in one embodiment or in different embodiments of the present disclosure can be combined.

The above, are only specific embodiments of the present disclosure, but the scope of protection of the present disclosure is not limited thereto, and any variation or substitution readily conceivable by any person skilled in the art within the technical scope disclosed in the present disclosure shall be covered by the scope of protection of the present disclosure. Accordingly, the scope of protection of the present disclosure shall be defined by the scope of protection of the claims.

What is claimed is:

1. A surface acoustic wave resonator device, having a body region and a peripheral region, wherein the peripheral region comprises a first peripheral region and a second peripheral region located at two opposite sides of the body region in a first direction, the surface acoustic wave resonator device comprises:

a piezoelectric substrate;

an interdigital transducer, disposed on a side of the piezoelectric substrate and comprising a plurality of interdigital electrodes, a first interdigital electrode lead-out part and a second interdigital electrode lead-out part, wherein the plurality of interdigital electrodes comprise a first interdigital electrode and a second interdigital electrode extending along the first direction and alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and a conductive structure, disposed on a side of the interdigital transducer away from the piezoelectric substrate, and at least overlapping with end portions of the plurality of interdigital electrodes close to the peripheral region in a third direction perpendicular to a main surface of the piezoelectric substrate, wherein the conductive structure at least comprises a body structure and a first sawtooth structure, the body structure continuously extends across the plurality of interdigital electrodes in the second direction, the first sawtooth structure is located at a side of the body structure away from the peripheral region in the first direction, and at least a portion of the body structure and the first sawtooth structure overlap with the end portions of the plurality of interdigital electrodes in the third direction.

2. The surface acoustic wave resonator device according to claim 1, wherein the body structure overlaps with the plurality of interdigital electrodes in the third direction, and overlaps with a gap between adjacent interdigital electrodes; and an orthographic projection of the first sawtooth structure on the piezoelectric substrate is offset from an orthographic projection of the gap between the adjacent interdigital electrodes on the piezoelectric substrate.

3. The surface acoustic wave resonator device according to claim 1, wherein an orthographic projection of the first sawtooth structure on the piezoelectric substrate is located within a range of orthographic projections of the plurality of interdigital electrodes on the piezoelectric substrate.

4. The surface acoustic wave resonator device according to claim 1, wherein the conductive structure comprises:

a first conductive layer, comprising a first body part and a first sawtooth part connected with each other, wherein the first sawtooth part at least comprises a first internal sawtooth located at a side of the first body part away from the first peripheral region; and a second conductive layer, disposed side by side with the first conductive layer in the first direction and comprising a second body part and a second sawtooth part connected with each other, wherein the second sawtooth part at least comprises a second internal sawtooth located at a side of the second body part away from the second peripheral region; the first body part and the second body part constitute the body structure, and the first internal sawtooth and the second internal sawtooth constitute the first sawtooth structure, wherein the first body part and the second body part each have a first sidewall and a second sidewall opposite to each other in the first direction, and the first internal sawtooth and the second internal sawtooth each comprise a plurality of internal extension parts protruding from the first sidewall of a corresponding body part, wherein the plurality of internal extension parts are arranged at intervals along the second direction and respectively overlap with the plurality of interdigital electrodes in the third direction.

5. The surface acoustic wave resonator device according to claim 4, wherein among an internal extension part in the first internal sawtooth or the second internal sawtooth and an interdigital electrode overlapping with each other, an orthographic projection of the internal extension part on the piezoelectric substrate is located within a range of an orthographic projection of the interdigital electrode on the piezoelectric substrate; or in the first internal sawtooth or the second internal sawtooth, a spacing between adjacent internal extension parts among the plurality of internal extension parts in the second direction is greater than or equal to a spacing between adjacent interdigital electrodes among the plurality of interdigital electrodes; or among an internal extension part and an interdigital electrode overlapping with each other, a width of the internal extension part in the second direction is smaller than or equal to a width of the interdigital electrode in the second direction; or among an internal extension part and an interdigital electrode overlapping with each other, two sidewalls of the internal extension part that are opposite to each other in the second direction are respectively aligned, in the third direction, with two sidewalls of the interdigital electrode that are opposite to each other in the second direction.

6. The surface acoustic wave resonator device according to claim 4, wherein the first interdigital electrode has a first electrode edge that is away from the first interdigital electrode lead-out part in the first direction; the second interdigital electrode has a second electrode edge that is away from the second interdigital electrode lead-out part in the first direction, wherein the second sidewall of the first body part and the second electrode edge are aligned with each other in the third direction; the second sidewall of the second body part and the first electrode edge are aligned with each other in the third direction; or the second sidewall of the first body part is offset in the first direction towards the first interdigital electrode lead-out part with respect to a second electrode edge of the second interdigital electrode, and the first body part also overlaps, in the third direction, with a connecting part of the first interdigital electrode located in the first peripheral region; or the second sidewall of the second body part is offset in the first direction towards the second interdigital electrode lead-out part with respect to a first electrode edge of the first interdigital electrode, and the second body part also overlaps, in the third direction, with a connecting part of the second interdigital electrode located in the second peripheral region.

7. The surface acoustic wave resonator device according to claim 4, wherein the conductive structure further comprises a second sawtooth structure located at a side of the body structure close to the peripheral region in the first direction, and at least a portion of the second sawtooth structure overlaps with the plurality of interdigital electrodes in the third direction.

8. The surface acoustic wave resonator device according to claim 7, wherein the first interdigital electrode has a first electrode edge that is away from the first interdigital electrode lead-out part in the first direction; the second interdigital electrode has a second electrode edge that is away from the second interdigital electrode lead-out part in the first direction;

wherein the second sawtooth structure extends beyond at least one of the first electrode edge and the second electrode edge in the first direction, and at least a portion of the second sawtooth structure is located in the peripheral region; or the second sawtooth structure has a sidewall aligned with the first electrode edge or the second electrode edge in the third direction.

9. The surface acoustic wave resonator device according to claim 7, wherein the second sawtooth structure overlaps, in the third direction, with at least one of, end portions of the plurality of interdigital electrodes close to the peripheral region and connecting parts of the plurality of interdigital electrodes located in the peripheral region.

10. The surface acoustic wave resonator device according to claim 7, wherein the first sawtooth part further comprises a first external sawtooth located at a side of the first body part close to the first peripheral region, and the second sawtooth part further comprises a second external sawtooth located at a side of the second body part close to the second peripheral region;

the second sawtooth structure comprises at least one of the first external sawtooth and the second external sawtooth.

11. The surface acoustic wave resonator device according to claim 10, wherein the first external sawtooth and the second external sawtooth each comprise a plurality of external extension parts, the plurality of external extension parts protrude from the second sidewall of a corresponding body part in the first direction and are arranged at intervals along the second direction;

the plurality of external extension parts of the first external sawtooth at least comprise a first extension sub-part, and the first extension sub-part overlaps with the first interdigital electrode in the third direction;

the plurality of external extension parts of the second external sawtooth at least comprise a second extension sub-part, and the second extension sub-part overlaps with the second interdigital electrode in the third direction.

12. The surface acoustic wave resonator device according to claim 11, wherein in the first conductive layer or the second conductive layer, a number of the plurality of internal extension parts is greater than or equal to a number of the plurality of external extension parts; or in the first conductive layer or the second conductive layer, in the second direction, a spacing between adjacent internal extension parts among the plurality of internal extension parts is smaller than or equal to a spacing between adjacent external extension parts among the plurality of external extension parts.

13. The surface acoustic wave resonator device according to claim 10, wherein the first internal sawtooth and the first external sawtooth are symmetrically disposed with respect to the first body part; and/or the second internal sawtooth and the second external sawtooth are symmetrically disposed with respect to the second body part.

14. The surface acoustic wave resonator device according to claim 7, wherein the second sidewall of the first body part is offset in the first direction away from the first peripheral region or towards the first peripheral region with respect to the second electrode edge of the second interdigital electrode;

the second sidewall of the second body part is offset in the first direction away from the second peripheral region or towards the second peripheral region with respect to the first electrode edge of the first interdigital electrode.

15. The surface acoustic wave resonator device according to claim 4, further comprising:

reflecting gratings, disposed on two opposite sides of the interdigital transducer in the second direction, wherein each reflecting grating comprises a plurality of reflective electrodes and a busbar, the plurality of reflective electrodes extend along the first direction and are arranged at intervals along the second direction, and the busbar extends along the second direction and is connected to the plurality of reflective electrodes, wherein the conductive structure further partially overlaps with the reflecting grating in the third direction.

16. The surface acoustic wave resonator device according to claim 15, wherein the conductive structure has a central region and an additional region; in the central region, the conductive structure overlaps with the plurality of interdigital electrodes in the third direction; in the additional region, the conductive structure overlaps with the plurality of reflective electrodes of the reflecting gratings in the third direction;

the first body part and the second body part each extend continuously from the central region to the additional region.

17. The surface acoustic wave resonator device according to claim 16, wherein in the additional region, the first conductive layer further comprises a first additional sawtooth structure, which is located on one side or two opposite sides of the first body part in the first direction;

the second conductive layer further comprises a second additional sawtooth structure, which is located at one side or two opposite sides of the second body part in the first direction.

18. The surface acoustic wave resonator device according to claim 1, further comprising:

a dielectric layer, disposed on the piezoelectric substrate and covering the interdigital transducer, wherein the conductive structure is located on a side of the dielectric layer away from the piezoelectric substrate.

19. A filter, comprising the surface acoustic wave resonator device according to claim 1.

20. A manufacturing method for a surface acoustic wave resonator device, wherein the surface acoustic wave resonator device has a body region and a peripheral region, and the peripheral region comprises a first peripheral region and a second peripheral region located at two opposite sides of the body region in a first direction, the manufacturing method comprises:

providing a piezoelectric substrate;

forming an interdigital transducer on a side of the piezoelectric substrate, wherein the interdigital transducer comprises a plurality of interdigital electrodes, a first interdigital electrode lead-out part and a second interdigital electrode lead-out part, and the plurality of interdigital electrodes comprise a first interdigital electrode and a second interdigital electrode extending along the first direction and alternately arranged along a second direction intersecting with the first direction; wherein the first interdigital electrode is located in the body region and extends across the first peripheral region to be connected to the first interdigital electrode lead-out part, and the second interdigital electrode is located in the body region and extends across the second peripheral region to be connected to the second interdigital electrode lead-out part; and forming a conductive structure on a side of the interdigital transducer away from the piezoelectric substrate, wherein the conductive structure at least overlaps with end portions of the plurality of interdigital electrodes close to the peripheral region in a third direction perpendicular to a main surface of the piezoelectric substrate, wherein the conductive structure at least comprises a body structure and a first sawtooth structure, the body structure continuously extends across the plurality of interdigital electrodes in the second direction, the first sawtooth structure is located at a side of the body structure away from the peripheral region in the first direction, and at least a portion of the body structure and the first sawtooth structure overlap with the end portions of the plurality of interdigital electrodes in the third direction.

* * * * *